United States Patent [19]

Henze

[11] Patent Number: 5,436,591
[45] Date of Patent: Jul. 25, 1995

[54] DEMODULATOR FOR RADIO DATA SIGNALS

[76] Inventor: Werner Henze, Wietzendiek 13, 30657 Hannover, Germany

[21] Appl. No.: 290,756

[22] PCT Filed: Feb. 18, 1993

[86] PCT No.: PCT/DE93/00158

§ 371 Date: Aug. 17, 1994

§ 102(e) Date: Aug. 17, 1994

[87] PCT Pub. No.: WO93/17509

PCT Pub. Date: Sep. 2, 1993

[30] Foreign Application Priority Data

Feb. 19, 1992 [DE] Germany .......... 42 05 014.6
Feb. 19, 1992 [DE] Germany .......... 42 05 015.4
Feb. 19, 1992 [DE] Germany .......... 42 05 016.2
Nov. 13, 1992 [DE] Germany .......... 42 38 373.0

[51] Int. Cl.$^6$ .......... H03D 3/00; H03D 3/04; H04H 1/00
[52] U.S. Cl. .......... 329/304; 329/310; 375/324; 375/333
[58] Field of Search .......... 329/304–310; 375/52–57, 80–87

[56] References Cited

U.S. PATENT DOCUMENTS

| 4,092,491 | 5/1978 | Frazer | 178/67 |
| 5,001,728 | 3/1991 | Füldner | 375/82 |
| 5,150,070 | 9/1992 | Rinaldi et al. | 329/307 |
| 5,175,507 | 12/1992 | Roither | 329/304 |
| 5,222,254 | 6/1993 | Verron et al. | 455/186.1 |
| 5,278,560 | 1/1994 | Hegeler et al. | 341/155 |

Primary Examiner—David Mis
Attorney, Agent, or Firm—Whitham, Curtis, Whitham & McGinn

[57] ABSTRACT

In a demodulator for radio data signals the transmission of which is made by phase-keying of a suppressed subcarrier the occurence of transient times is avoided in that the received signal of subcarrier frequency is transformed into a first square wave signal (A) and that a second square wave signal of subcarrier of frequency is formed which is brought into such a time relationship to the first square wave signal that by means of a comparison of both square wave signals a phase information for the first square wave signal (A) is obtained. Demodulator can be implemented by means of only digital components.

36 Claims, 18 Drawing Sheets

DEMODULATOR FOR RADIO DATA SIGNALS

DESCRIPTION

The present invention is related to a demodulator for radio data signals according to the introductory part of claim 1.

By means of the well known radio data system data signals can be transmitted additionally to the audio signals, which data signals e.g. comprise the name of the transmitted program and other information. In order to assure the compatibility with the audio signals as well as with traffic broadcast signals for FM stereo radio transmission the carrier of 57 kHz used also for traffic broadcast transmission is modulated with the data to be transmitted, wherein, however, the sidebands are choosen different from the modulation frequencies used for the different signals of traffic broadcast transmission. A biphase coding is used effecting that no spectral components result at 57 kHz and that the clock is transmitted implicitly. The whole spectrum of the modulated radio data signals, in the following called RDS signals, is limited to ±2,4 kHz.

Conventional RDS decoders rely on the use of phase locked loops. In the magazine Funkschau No. 7/1988, page 42, a RDS decoder is disclosed to which the 57 kHz signal is fed after amplification and amplitude limitation, i.e. as a square wave signal. RDS information is demodulated by means of a synchronous demodulator with carrier recovery (Costas loop).

It is the object of the present invention to provide a demodulator for RDS signals in which no delay due to rise times of phase locked loops occur.

According to the present invention this problem is solved by a demodulator comprising the features described generally in FIG. 1.

The demodulator according to the present invention can advantageously be built up by means of digital components only, allowing a low cost realization as an integrated circuit and rendering expensive matching works during production unnecessary.

The demodulator according to the present invention can also be put into effect by means of suited programs for signal processors or other micro electronic components. Since the demodulator according to the present invention can work on a high speed it may advantageously be used in a broadcast receiver in which short periods checks on alternative frequencies are performed (e.g. according to DE 41 03 062 A1) without disturbing the reception of the actual tuned frequency.

For producing the second square wave signal in an embodiment of the invention a signal on about a subcarrier frequency is produced the phase of which is matched to the phase of the received RDS signal from time to time. In a further embodiment the second signal is produced by delaying the first signal by half a RDS data period.

Advantageous embodiments of the invention are recited in the subclaims and will be explained by means of examples of the invention and their properties and advantages with reference to the drawing, in which:

Figure 1:
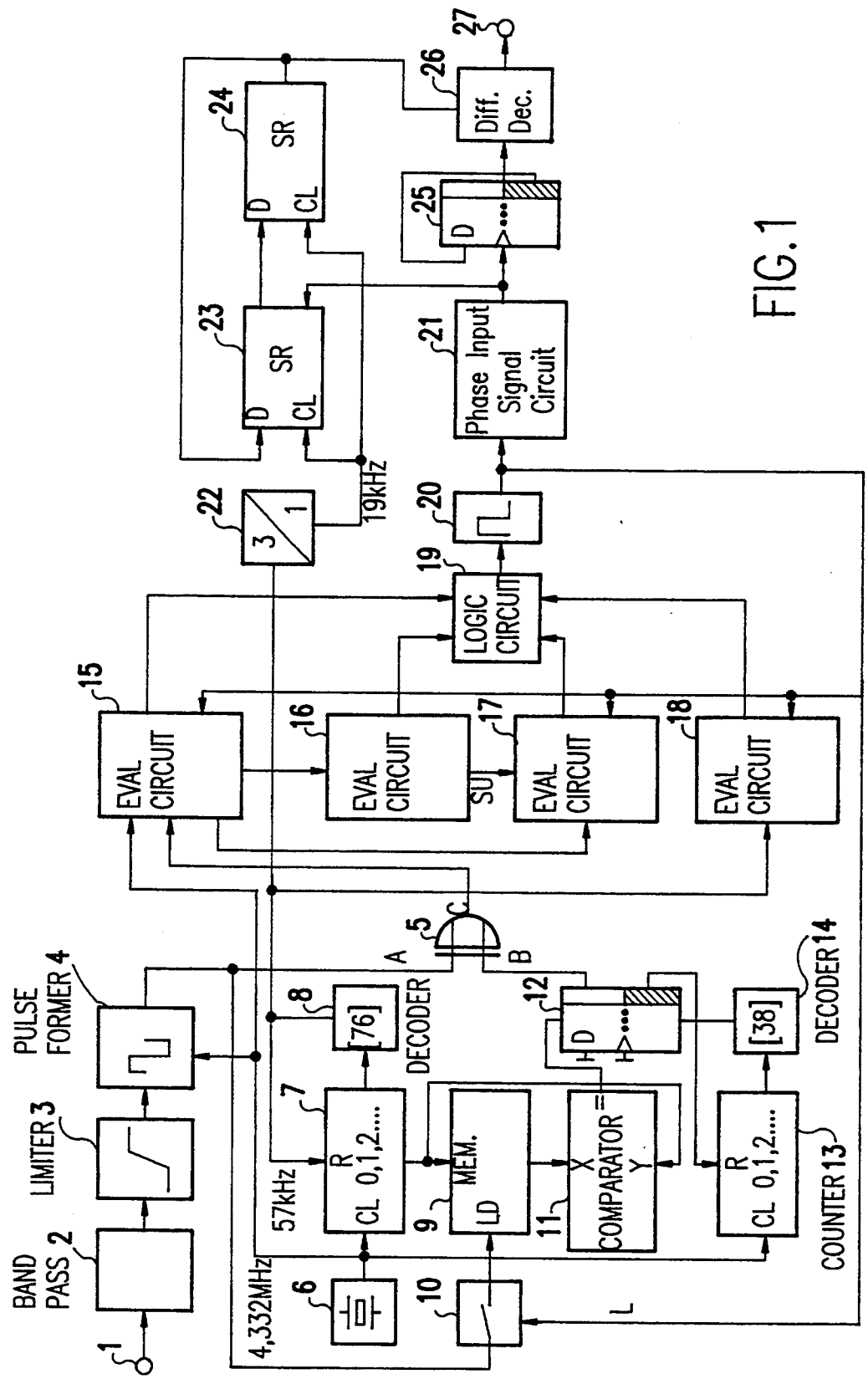
FIG. 1 shows a block diagram of a demodulator according to a first embodiment

In the drawings counters are indicated by a symbol "0, 1, 2...", memories by "MEM" and shift registers by "SR". "CL" means clock terminal, "R" reset terminal, "D" data input and "LD" load input. Inputs to comparators are indicated by X and Y and the output by means of the respective condition. Decoder producing information depending on the content of a counter are indicated by means of the respective counter state in square brackets. Some inputs and outputs are provided with arrows and numerals indicating from and to which components the respective signals are conducted.

Referring to FIG. 1 the received multiplex signal is fed to the demodulator at 1. By means of a band pass 2 the RDS signal is recovered from the multiplex signal and amplitude limited in a subsequent limiter 3. By means of a pulse former 4 a square wave signal is formed from the amplitude limited RDS signal having a pulse duty ratio of 50% and comprising the phase modulation of the RDS signal, said square wave signal being referenced as signal A in the following. Signal A is combined in a logic circuit 5 with a signal B also having the form of a meander, having a frequency of 57 kHz and the phase of which being synchronized at certain times to the phase of the signal A.

A quartz oscillator 6 having a frequency of 4,332 MHz is used for producing a 57 kHz clock signal by dividing the frequency of 4,332 MHz by means of a first counter 7 and a first decoder 8. As soon as a first counter 7 to which the output signal of the quartz oscillator 6 is fed as a clock has counted to 76 this is realized by decoder 8 and the counter is reset.

For producing a signal B the counter state of the first counter 7 is fed into a memory 9 at the time of an edge of signal A which is selected by means of a load pulse L. For this purpose signal A is fed to the load input of memory 9 via a gate circuit 10. Gate circuit 10 will be explained in detail with reference to FIG. 3.

Content of memory 9 is compared with content of first counter 7 by means of a comparator 11. If both values are equal a flip-flop 12 is set at the output of which signal B is present. By setting flip-flop 12 the leading edge of signal B is produced. Trailing edge of signal B is produced by means of a second counter 13 and second decoder 14. Second counter 13 is fed by the 4,332 MHz clock and reset by setting the flip-flop 12. If counter has reached half of the period of signal B, which is the case at a counter state 38 flip-flop is reset by means of second decoder 14.

Logic circuit 5 essentially corresponds to an exclusive OR-circuit. A more complicated embodiment is described in detail with reference to FIG. 7. Output signal of logic circuit 5 therefore has a first logic level if signals A and B are different and has the other logic level if signals A and B are equal. Signal C being combined in this way indicates phase differences between signals A and B. By means of said phase differences four different conditions are examined in four evaluation circuits.

If a RDS signal the is received without traffic broadcast signal pulse width of signal C becomes smaller with reference to the time of the e.g. maximum positive phase deviation, if the time of the maximum negative phase deviation has passed.

If a RDS signal with traffic broadcast signals is received the pulse width of signal C becomes smaller if the subcarrier shows its maximum phase deviation with respect to its zero phase.

As will be described later, a load pulse is produced in the first case after occurrence of the maximum phase deviation and in the second case at each maximum phase deviation of the sub-carrier.

The evaluation circuit 15 receives besides signal C the 4,332 MHz clock signal and load pulse L, which is derived from the output signals of evaluation circuits 15 to 18 by means of a further logic circuit 19. As will be described later with reference to FIG. 4 evaluation circuit 15 checks if the pulse width of signal C becomes continuously smaller. A corresponding output signal is fed to the further logic circuit 19.

For sensing the pulse width of signal C evaluation circuit 15 comprises a counter which counts pulses of the 4,332 MHz clock signal during the duration of one pulse each of signal C. Counter state at the end of said pulse of signal C corresponds accordingly to the pulse width. Said counter state is fed from evaluation circuit 15 to evaluation circuit 16. There the condition is checked whether or not the phase deviation has exceeded a predetermined threshold value. If this is the case a corresponding signal is fed to the further logic circuit 19. Furthermore evaluation circuit 16 produces a threshold value switching signal being fed to evaluation circuit 17 and being used for examination whether the summation of all clock pulses of all counted pulses of signal C has exceeded a predetermined threshold value. If this is the case the signal is fed to the further logic circuit 19, too. Finally a signal is produced in evaluation circuit 18 and fed to the further logic circuit 19 indicating whether or not a minimum time has lapsed after a positive edge of clock signal (57 kHz).

From output signal of further logic circuit 19 the load pulse L is produced by means of a further pulse former 20. Said load pulse L is fed to gate circuit 10 on one hand and to circuit 21 for realizing pulse gaps being represented in detail in FIG. 6. By means of circuit 21 it is checked if the phase of input signal has changed during a half or a full bit clock period, i.e. it is sensed whether or not a load pulse is present after half a bit clock period. If no load pulse is present a data clock is edited.

A bit clock signal is derived from 57 kHz clock signals by means of a frequency divider 22 and of two shift registers 23, 24. Frequency divider 22 produces a 19 kHz signal clock for shift registers 23, 24. Shift register 23 is loaded by each data pulse signal produced by circuit 21 to binary 1000 0000 and shift register 24 is set to 0. Due to shift clock of 19 kHz sixteen shift clocks are present within a RDS bit clock period. After eight shift clocks the middle of data signal is reached, i.e. the "1" loaded into shift register 23 then is present at output of shift register 24. As long as no data clock pulse occurs loaded "1" is cyclically shifted through shift registers 23, 24 and occurs at output of shift register 24 after each RDS bit clock period. The advantage of this circuit arrangement is the new synchronization of bit clock for each data clock.

Data pulse signal triggers a flip-flop 25 producing pulses changing the level from one to another for each pulse of data pulse signal. This signal corresponds essentially to RDS signal, wherein, however, difference coding being performed by the transmitting station still is present. Said difference coding is decoded by means of a well-known circuit 26 so that the demodulated RDS signal is present at output 27.

Figure 2:
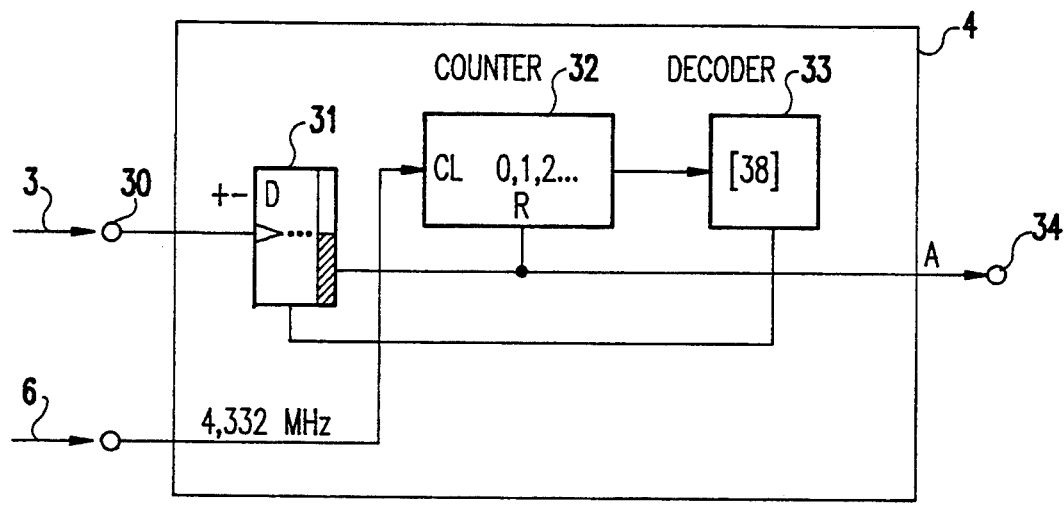
FIG. 2 is a block diagram of a first pulse former being part of the demodulator according to FIG. 1

Since evaluation circuits 15 to 18 evaluate both the leading edges and trailing edges of signal A a constant pulse duty ratio is highly important, being however not fulfilled by only limiting the modulated RDS signal by means of limiter 3. Therefore, a signal having a pulse duty ratio of 50% is produced by pulse former 4. For this purpose in the pulse former 4, an advantageous embodiment of which is illustrated in FIG. 2, output signal of limiter 3 is fed to the clock input of a flip-flop 31 the data input of which is supplied with a positive voltage. By means of the leading edge of the limiter modulated RDS signal flip-flop 31 is set. Inverting output of flip-flop 31 is connected with the reset terminal of a counter 32 to which the 4,332 MHz clock signal is fed.

As soon as flip-flop 31 is set, counter 32 starts counting. By means of decoder 33 counter 32 is reset at counter state [38] by means of resetting flip-flop 31. Due to the frequency ratio of 76:1 of the 4,332 MHz clock to the carrier frequency of 57 kHz at counter state [38] half of the period has been consumed. Therefore, the pulse duty ratio of signal at output 34 is 50%.

Figure 3:
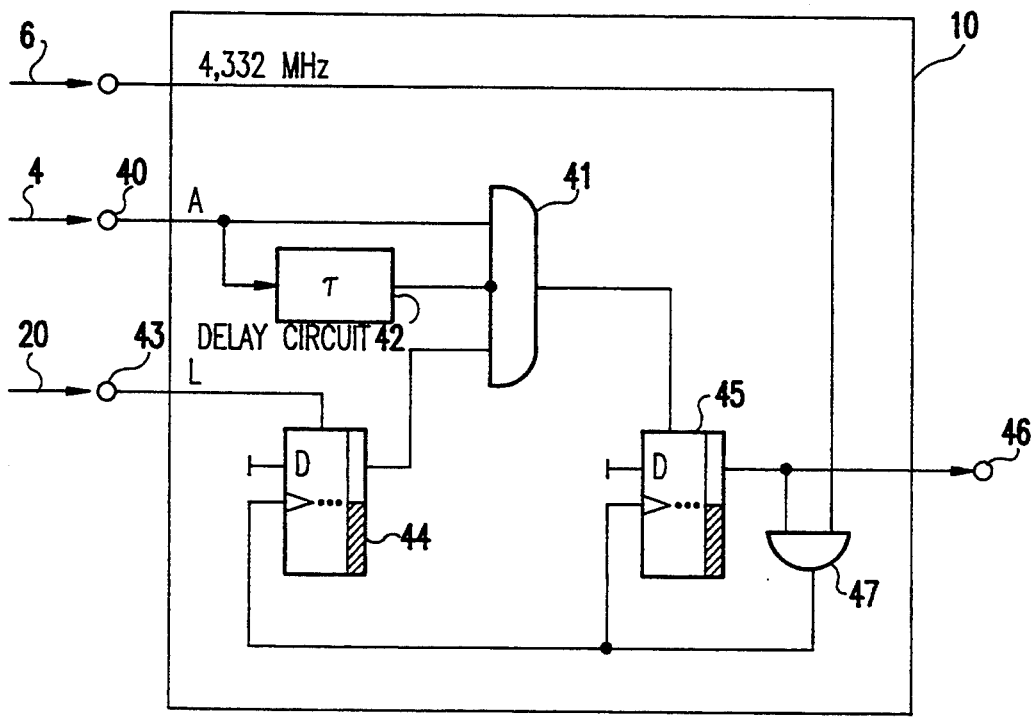
FIG. 3 is a block diagram of a gate circuit being part of the demodulator according to FIG. 1

FIG. 3 is a block diagram of gate circuit 10 (FIG. 1). From signal A a short pulse is produced by means of an AND circuit 41 one input signal of which is inverted and a delay circuit 42, which short pulse corresponds to leading edges of signal A being fed to input 40. Delay circuit 42 may be implemented in a simple manner by logic elements, e.g. serially connected invertors. Load pulse L being supplied to one input 43 sets a flip-flop 44 the output of which is connected to a further input terminal of AND circuit. A further flip-flop 45 can only be set to a time in which flip-flop 44 is set and the pulse derived from the leading edge of signal A is 1. As soon as the further flip-flop 45 is set memory 9 (FIG. 1) is loaded via output 46.

After setting the further flip-flop 44 both flip-flops 44, 45 are reset, if the 4,332 MHz clock signal becomes 0. For this purpose the 4,332 MHz clock signal is supplied to the clock inputs of flip-flops 44, 45 through an AND-circuit 47.

Figure 4:
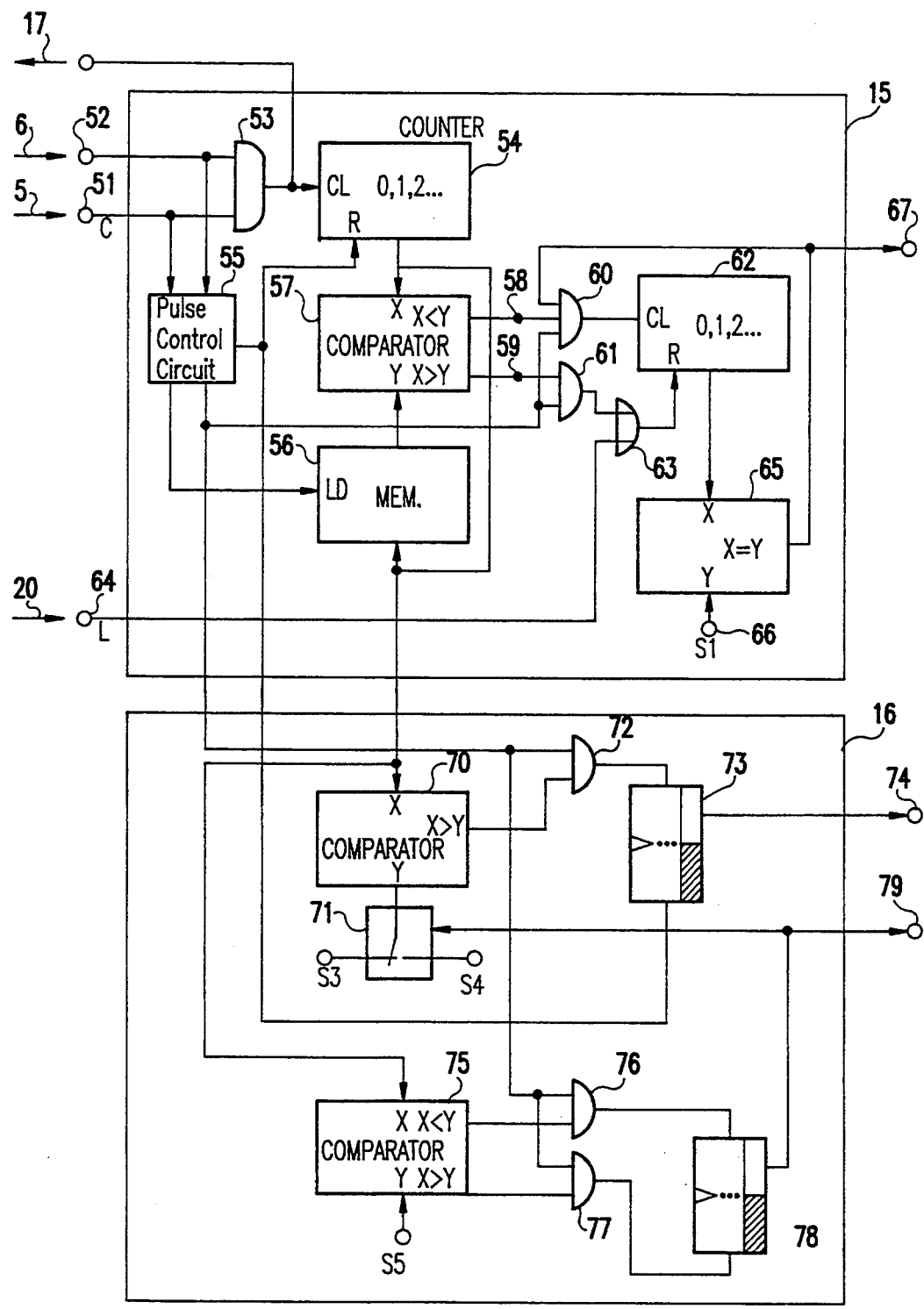
FIGS. 4 and 5 show evaluation circuits being part of the demodulator according to FIG. 1

FIG. 4 represents block diagrams of evaluation circuits 15 and 16. Signal C is supplied to evaluation circuit 15 through an input terminal 51. Furthermore evaluation circuit 15 receives the 4,332 MHz clock signal through a further input terminal 52. Both signals are supplied to a counter 54 through an AND-circuit 53 which counter therefore only receives clock signals during phase differences between signals A and B. Signal C and the 4,332 MHz clock signal are fed to a circuit 55 for pulse control producing a reset signal for counter 54, a load signal for a memory 56 and further signals controlling the timing of functions being described in the following. After each pulse of signal C counter state of counter 54 is written into memory 56. Previously, however, counter state at the end of the pulse of signal C is compared with the content of memory 56 by means of comparator 57.

Comparator 57 has two output terminals at which signals are present indicating if signal at input terminal X is greater than the signal at input terminal Y or signal at input terminal X is smaller than signal at input terminal Y, respectively. Both output terminals 58, 59 are connected with AND-circuits 60, 61. Output terminal of AND circuit 60 is connected to clock input of a further counter 62 whereas output of AND-circuit 61 is connected to reset input of counter 62 through OR-circuit 63.

Load pulse L is supplied to OR-circuit 63 through an input terminal 64. Counter state of counter 62 is compared with a threshold value S1 being fed at 66 in a further comparator 65. If both supplied signals are equal, output of comparator 65 is a signal indicating that the condition is met and being present at output terminal 67 of evaluation circuit 15. If pulse width has become smaller from one pulse of signal C to the following, counter 62 is incremented by means of comparator 57 through output terminal 58 and AND-circuit 60. If, however, pulse width has become greater counter 62 is decremented through output 59 of comparator 57, AND-circuit 61 and OR-circuit 63. Consequently counter state (counter 62) can rise to threshold value S1 being supplied at 66 only if pulsewidth is continuously reduced during a number of periods of signal C being determined by S1.

Evaluation circuit 16 also being represented in FIG. 4 checks if the second condition is met, namely if pulsewidth of signal C has exceeded the predetermined value. For this purpose content of memory 56 is compared with a threshold value S3 or a threshold value S4 in a comparator 70, which threshold values are alternatively supplied to input terminal Y of comparator 70 through a controllable switch 71. If the content of memory 56, representing the pulsewidth, is greater than the corresponding threshold value S3 or S4, a flip-flop 73 is set through an AND-circuit 72 so that at the output terminal 74 of flip-flop 73 a signal is present indicating that the second condition is met. Flip-flop 73 is reset after the end of the pulse of signal C by means of a reset signal produced by pulse control circuit 55.

The selection of the threshold value for comparator 70 depends on whether or not a traffic broadcast signal is present in the received signal besides the RDS-signal. In this case a smaller maximum phase difference between signals A and B can be expected so that the threshold is reduced. For sensing this a further comparator 75 is provided for being supplied with a threshold value S5 and setting or resetting a flip-flop 78 through AND-circuits 76, 77 in correspondence with pulse width being greater or smaller than threshold value S5. Output signal SU of flip-flop 78 is on one hand used for controlling switch 71 and is on the other hand available for evaluation circuit 17 being illustrated in FIG. 5 through output terminal 79.

Figure 5:
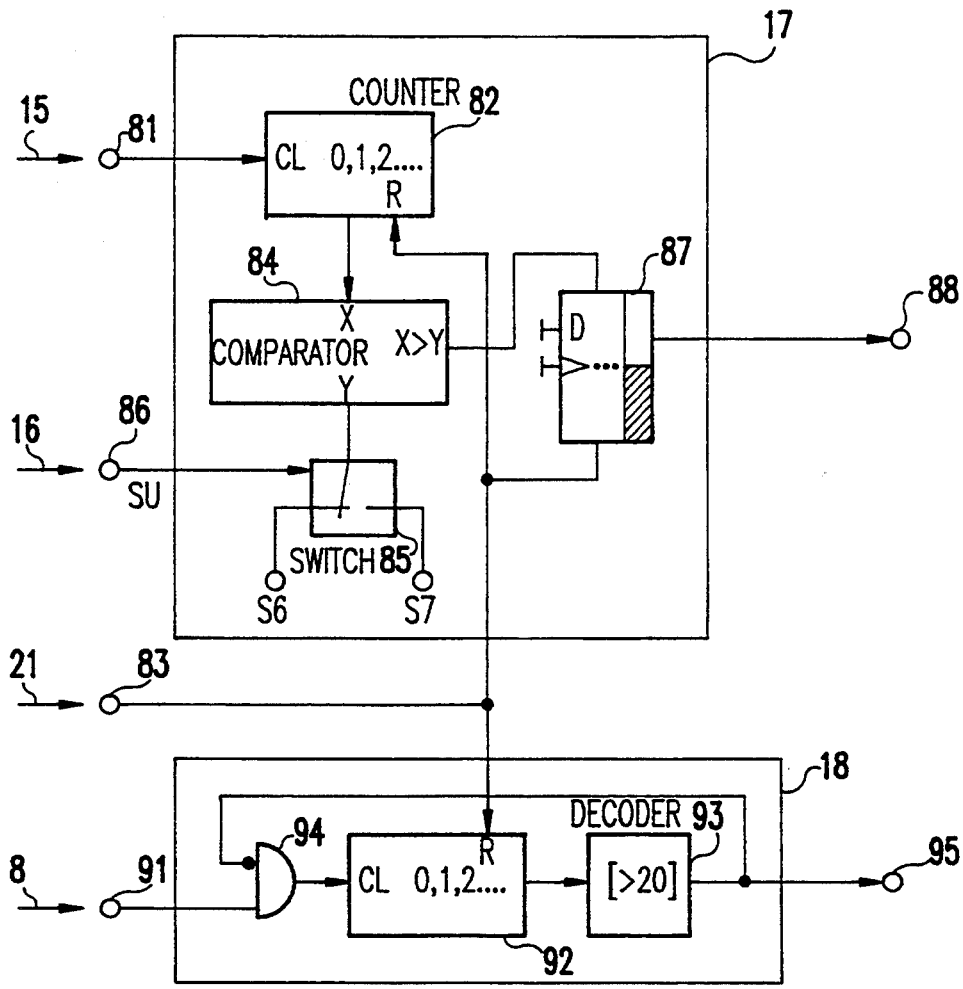

FIG. 5 shows evaluation circuits 17 and 18 (FIG. 1). Evaluation circuit 17 checks whether or not the summation of pulsewidths of all pulses of signal C starting from the last load pulse exceeds a threshold value. For this purpose output signal of AND-circuit 53 (FIG. 4) is fed to input terminal 81 as a clock signal for a counter 82. Counter 82 is reset by load pulse L being supplied to an input terminal 83. By this, counter receives the number of pulses of the 4,332-MHz-clock signal occuring during pulses of the signal C since the last load pulse. This number corresponds to the summation of all pulse widths.

For a comparison with a threshold value a comparator 84 is provided which is alternatively supplied with a threshold value S6 or a threshold value S7 through a controllable switch 85. Controllable switch 85 can be switched by means of signal SU being present at output terminal 79 of evaluation circuit 16 (FIG. 4) and supplied through input terminal 86. As soon as the counter state of counter 82 exceeds the corresponding threshold value a flip-flop 87 is set at the output 88 of which a signal is present corresponding to the third condition. Flip-flop 87 is reset by load pulse L.

By means of evaluation circuit 18 also being represented in FIG. 5, it is checked whether or not a certain predetermined time has passed after the last load pulse. This time is sensed by counting the 57-kHz-pulses supplied at 91 by means of a counter 92, and a decoder 93. Counter 92 is reset by means of load pulse L. As long as counter state is below or equal to [20] decoder 93 edits the logic level 0. Correspondingly AND-circuit 94 having an inverting input transmits count pulses to clock input of counter 92. If counter state [20] is exceeded output signal of decoder jumps to logic level 1 after which AND-circuit 94 interrupts a further counting. Thereby signal at output 95 of evaluation circuit 18 assumes level 1 indicating that after the last load pulse a certain predetermined time has lapsed. Thereby a premature generation of a load pulse after meeting the first three conditions is excluded.

After the meeting of said four conditions is checked by means of the further logic circuit 19 (FIG. 1) the load pulse L is produced from output signal of the further logic circuit 19 by pulse former 20. This is according to FIG. 6 performed simply by supplying output signal of the further logic circuit 19 within pulse former via an input terminal 100 directly to a first input terminal of AND-circuit 101 and through a delay member 102 to an inverting second input of AND-circuit 101. Delay member 102 may simply be implemented by logic circuits and determines the pulse duration of load pulse L being present at output terminal 103.

Figure 6:
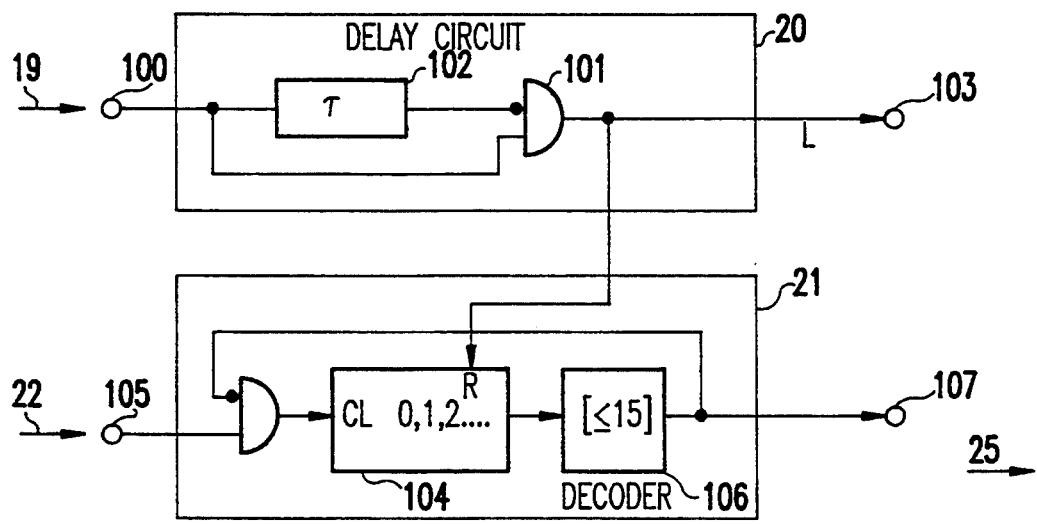
FIG. 6 shows a further evaluation circuit being part of the demodulator according to FIG. 1

For producing the data pulse signal load pulse is supplied to a circuit 21 being also represented in FIG. 6. Here load pulse L serves for resetting counter 104 to which the 19 kHz clock signal which is supplied through input terminal 105 from frequency divider 22 (FIG. 1) is fed. If a threshold value determined by decoder 106 is exceeded counting is terminated and flip-flop 25 (FIG. 1) connected to output terminal 107 of circuit 21 is set. In this way flip-flop 25 supplies the already demodulated RDS-signal, however without a difference decoding.

Figure 7:
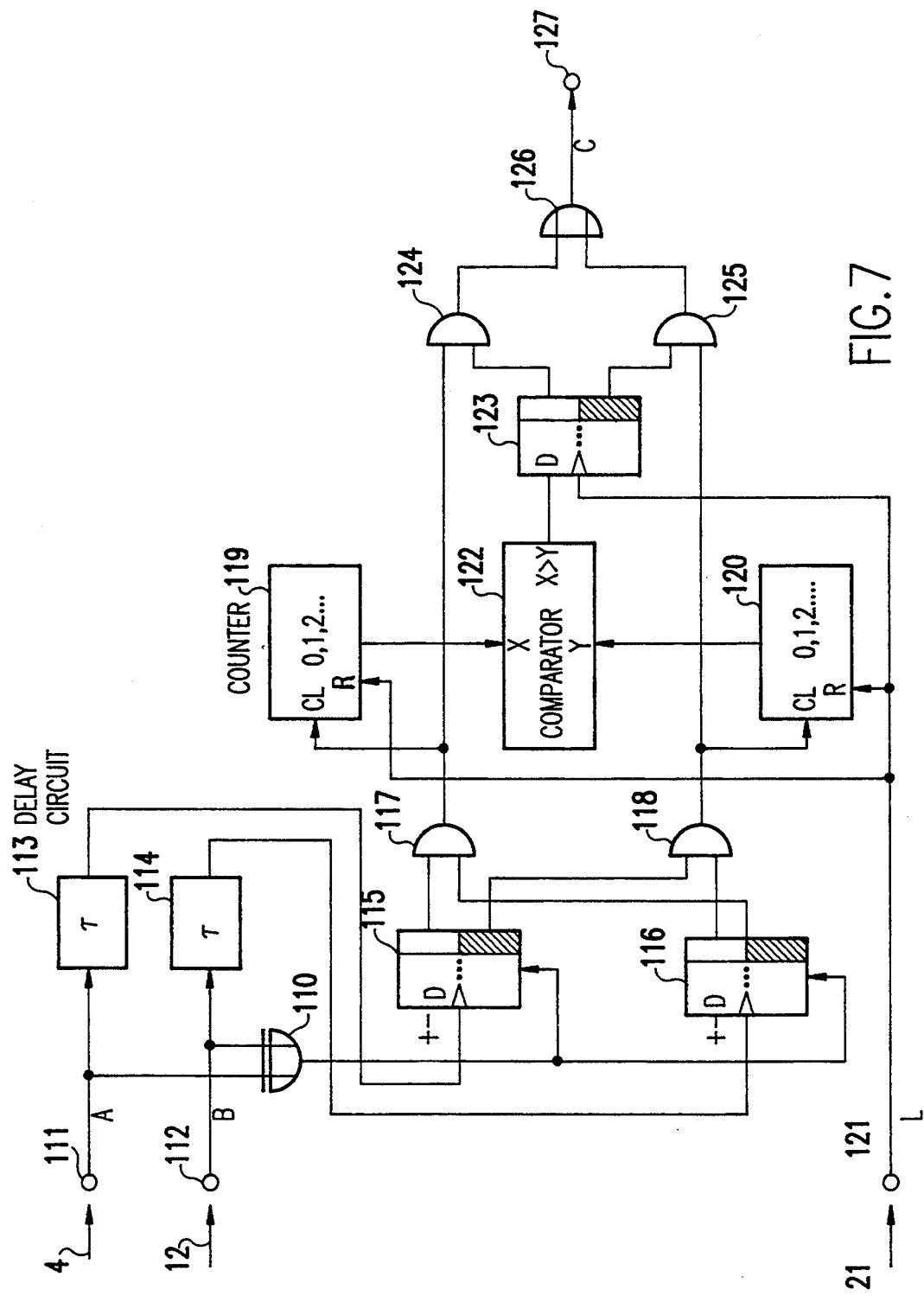
FIG. 7 shows an embodiment of a logic circuit being part of the demodulator according to FIG. 1

FIG. 7 shows an embodiment for a logic circuit 5 (FIG. 1) serving for detecting which of the two possible phase relations between signal A and B is dominant between two load pulses. A corresponding pre-setting for the phase relation to be expected is performed by means of flip-flop 123. Noise resistance of demodulator is improved thereby.

Signals A and B are supplied to delay circuit 113, 114, each, through input terminals 111, 112. Delayed signals A and B are clock signals for flip-flops 115, 116 which are set due to positive voltages at data inputs. Resetting of flip-flops 115, 116 is performed by output signals of exclusive OR-circuit 110.

If signals A and B are different, flip-flops can be set whereas they are reset if signals A and B are equal. Outputs of flip-flops 115 and 116 are connected with clock inputs of counters 119, 120 through AND-circuits 117, 118, which counters are reset by load pulse L being supplied at 121. Due to AND-circuits 117 and 118 only that signal of that flip-flop 115, 116 respectively, can be fed to the corresponding counter 119 or 120, respectively, which has been set at first.

At the time of the load pulse one of the counters 119, 120 will comprise a greater value than the other one. This is detected by means of comparator 122. Depending on said comparison a flip-flop 123 is set for which load pulse L is clock. By resetting counters 119, 120 counts can be restarted. Output terminals of AND-circuits 117, 118 are connected to an input of further AND-circuits 124, 125, each, the other inputs of which are connected to outputs of flip-flop 123.

A pre-selection of pulses at the outputs of AND-circuits 117 and 118 is performed by means of flip-flop 123 and AND-circuits 124 and 125. Via OR-circuit 126 selected pulses from signal C are available at output terminal 127.

Figure 8:
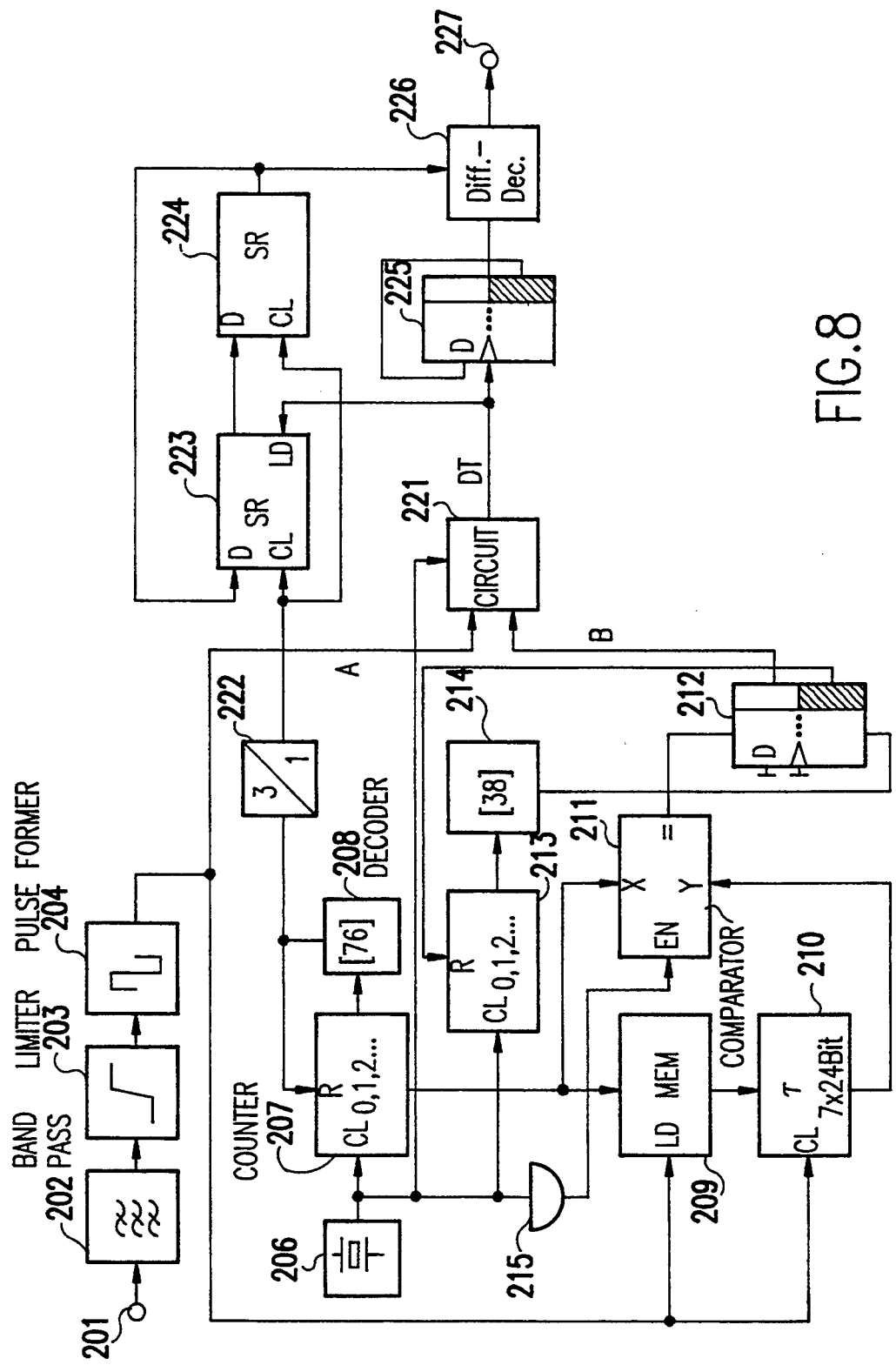
FIG. 8 is a block diagram of a demodulator according to a further embodiment of the invention

A second embodiment of demodulator is represented in FIG. 8 and supplied with the received multiplex signal at 201. By means of bandpass 202 the RDS-signal is recovered from the multiplex signal. The amplitude of RDS-signal is limited by a subsequent limiter 203. By pulse former 204 a square wave signal with a pulse duty ratio of 50% is produced from the limited RDS-signal which square wave signal comprises the phase modulation of the RDS-signal and is called signal A in the following.

A quartz oscillator 206 having a frequency of 4,332 MHz serves for producing an 57 KHz clock signal by dividing the 4,332 MHz frequency by [76] by means of a first counter 207 and a first decoder 208. As soon as the first counter 207 being supplied with the output signal of quartz oscillator 206 as clocked, has counted up to [76] this is detected by decoder 208 and counter is reset.

By means of circuits 209 to 215 signal A is delayed by a half period of RDS-bit clock. Thereby the phase relation of signal A is strictly conserved also in the delayed signal. Delayed signal is called signal B in the following. At each positive edge of signal A counter state of counter 207 comprising 7 bits is transferred into memory 209. Thereby the phase difference between the 57 kHz clock signal produced by means of counter 207 and decoder 208 and signal A is fixed for the corresponding edge of signal A. Said phase difference is delayed by means of a delay circuit 210 for half a bit clock period which delay is preferably done by means of seven shift registers having each a length of 24 bit.

Counter states transferred into memory 209 are shifted by means of edges of signal A to the output of the shift registers. Output signals of shift registers comprising 7 bits are compared with the counter state of counter 207 by means of comparator 211. Output signal of comparator is released if counter 207 is not incremented; for this purpose the 4,332 MHz clock signal is fed to an enable input EN of comparator through an inverter 215. If the output signal of delay circuit 210 equals the counter state, a flip-flop 212 is set and counter 213 is released thereby starting a pulse of signal B. If counter 213 reaches counter state 38 decoder 214 resets flip-flop 212 thereby terminating the "1" level of signal B and resetting counter 213.

Figure 10:
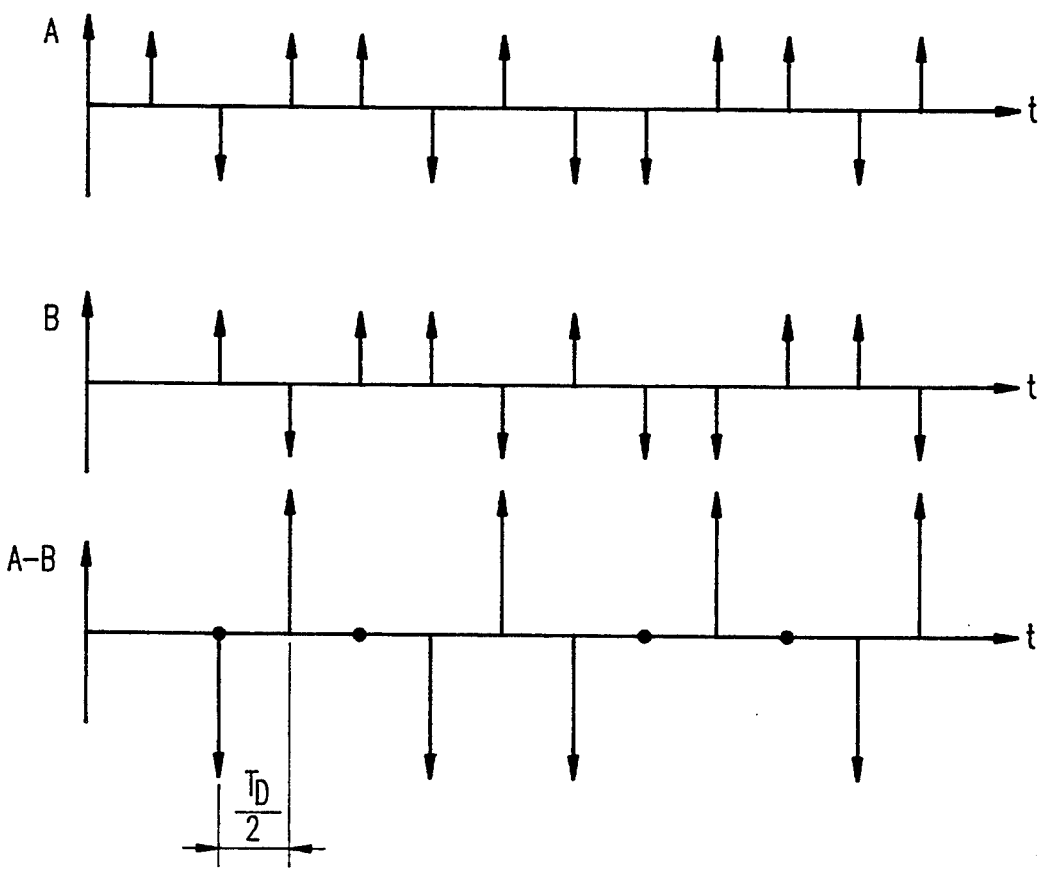
FIG. 10 is a schematic diagram of RDS signal vectors of various signals occurring in the demodulator according to FIG. 8
Figure 11:
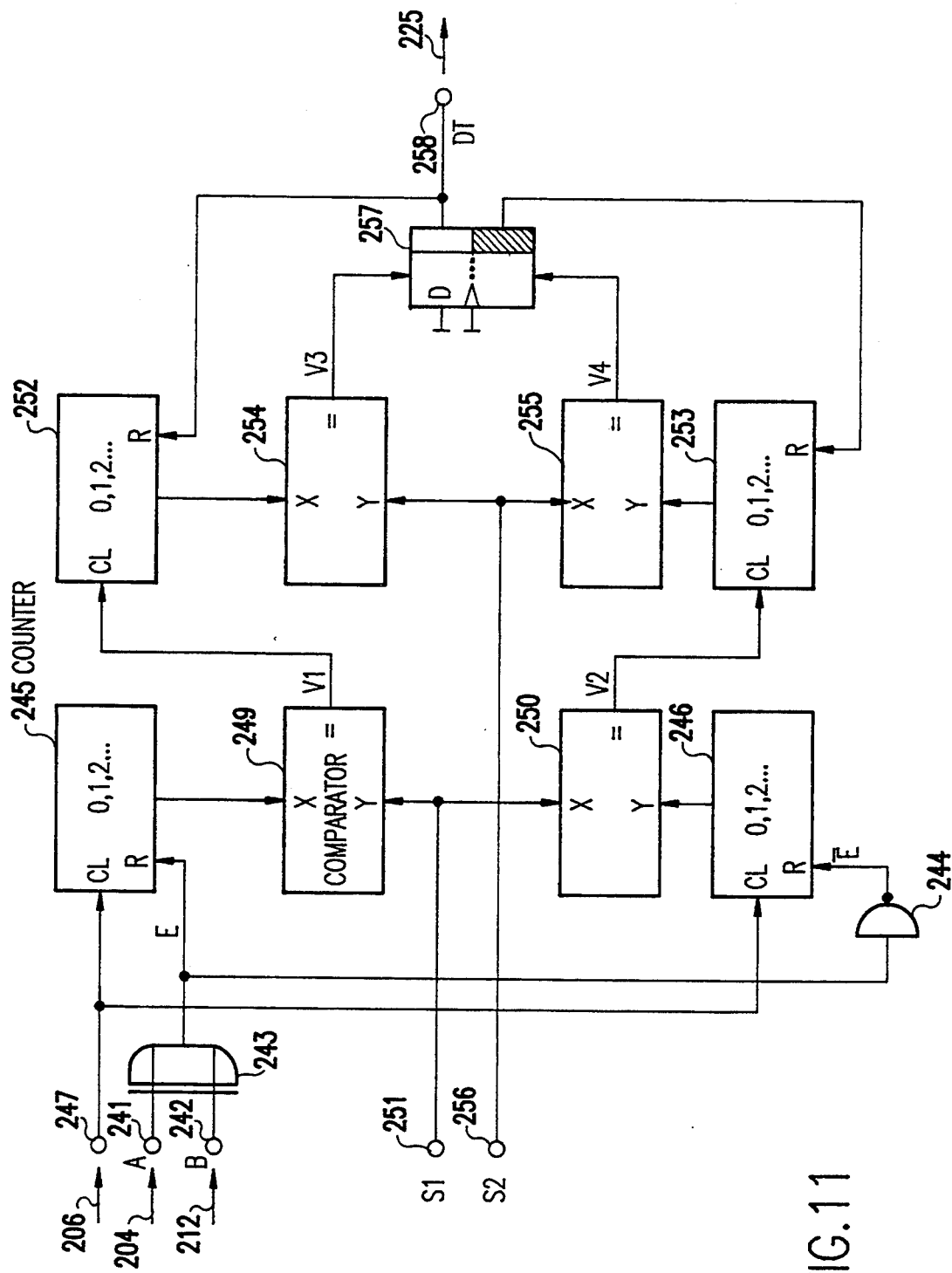
FIG. 11 is a block diagram of a circuit for recovering data clocks being part of the demodulator according to FIG. 8

From signals A and B circuit 221, being explained in more detail with respect to FIGS. 10 and 11, extracts RDS-clock DT.

A bit clock signal is derived from said 57-kHz-clock-signal by means of frequency divider 222 and of two shift registers 223, 224. Frequency divider 222 at first produces a 19 kHz-signal clock for shift registers 223, 224. Shift register 223 is loaded to binary 1000 0000 at each data pulse signal produced by circuit 221, and shift register 224 is set to 0. For a shift clock of 19 kHz one RDS-bit clock period comprises 16 shift clocks. After eight shift clocks the middle of data signal has been reached, i.e. the "1" loaded into a shift register 223 has arrived at output of shift register 224. As long as no data clock pulse occurs the loaded "1" is cyclically shifted through shift registers 223, 224. At the output of shift register 224 the "1" occurs at intervals of one RDS-bit clock period each. It is an advantage of the circuit that bit clock is synchronized anew for each data clock.

Data pulse signal triggers a flip-flop 225 thereby producing pulses which change their level from one level to the other at each pulse of data pulse signal. Produced signal corresponds essentially to RDS-signal, however, the difference coding performed for transmission is still present. Difference coding is decoded by means of a well-known circuit 226 so that at output terminal 227 demodulated RDS-signal is available.

Figure 9:
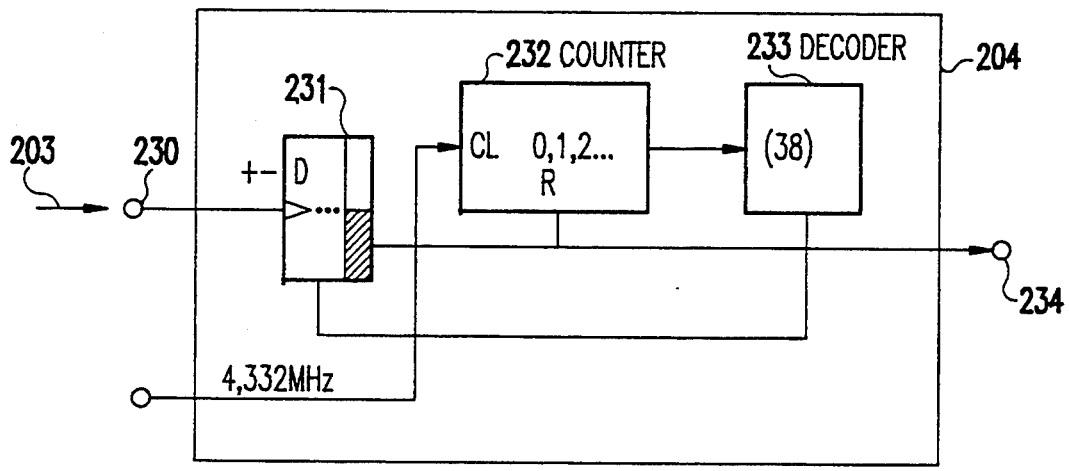
FIG. 9 is a block diagram of a pulse former being part of the demodulator according to FIG. 8

For the function of circuit 221 a pulse duty ratio of signals A and B of 50% is necessary. For signal B this is assured by means of clock 213 together with decoder 214. For signal A in the pulse former 204, a preferred embodiment of which is illustrated in FIG. 9, output signal of limiter is fed to clock input of flip-flop 231 the data input of which receives a positive voltage. By the leading edge of the limited modulated RDS-signal flip-flop 231 is set. The inverting output of flip-flop 231 is connected to the reset input of counter 232 being clocked by the 4,332 MHz-clock-signal.

As soon as flip-flop 231 is set, counter 232 starts counting. By means of decoder 233 counter 232 is reset at counter state [38] by resetting flip-flop 231. Due to the frequency ratio of 76:1 of the 4,332 MHz-clock to carrier frequency of RDS-signal of 57 kHz at counter state 38 the half period has lapsed. Pulse duty ratio of signal at output 234 therefore is 50%.

FIG. 10 represents signal vectors of signals A and B wherein timings are selected at which the phases of the signals are extreme. Period $T_d/2$ corresponds to a half bit clock period. Forming the difference of signals A and B results in a doubling of amplitude of RDS wanted signal or to an extinction. Consequently those vectors remaining show the phase difference. Since the phase difference vectors are doubled an amplitude compared with the signals used in conventional demodulators, sensitivity of the described novel RDS-demodulator is considerably enlarged. Due to the amended sensitivity a number of advantages result with RDS-reception. E.g. frequency-diversity is possible even if with stations being received only weakly. PS (program service name) can be detected due to a smaller error rate faster with weakly received signals or reading of PS is now possible with weak transmissions.

FIG. 11 shows details of circuit 221 (FIG. 8). Signals A and B are fed to inputs 241, 242 and are combined by means of an exclusive OR-circuit 243. A result in signal E is used for resetting counter 245 and after being inverted at 244 for resetting counter 246. Both counters 245, 246 are clocked by means of a 4,332 MHz-clock-signal supplied at 247.

Outputs of counters 245, 246 are connected to a comparator 249, 250 each to the further input 251 of which a reference signal S1 is fed. If signals at both inputs of comparator are equal, comparators 249, 250 output a signal V1 or V2, respectively, being fed to a clock input of further counter 252 or 253.

Outputs of counters 252, 253 are connected to inputs of further comparators 254, 255 to which a second reference signal S2 is fed via input terminal 256. If both signals fed to a comparator are equal comparators 254, 255 output a signal V3 or V4, respectively, by which a flip-flop 257 is set or reset. Output 258 of flip-flop 257 forms the output terminal of the circuit arrangement according to FIG. 11 and is furthermore connected to the reset input of counter 252. The other output of flip-flop 257 is connected to reset input of counter 253.

Figure 12:
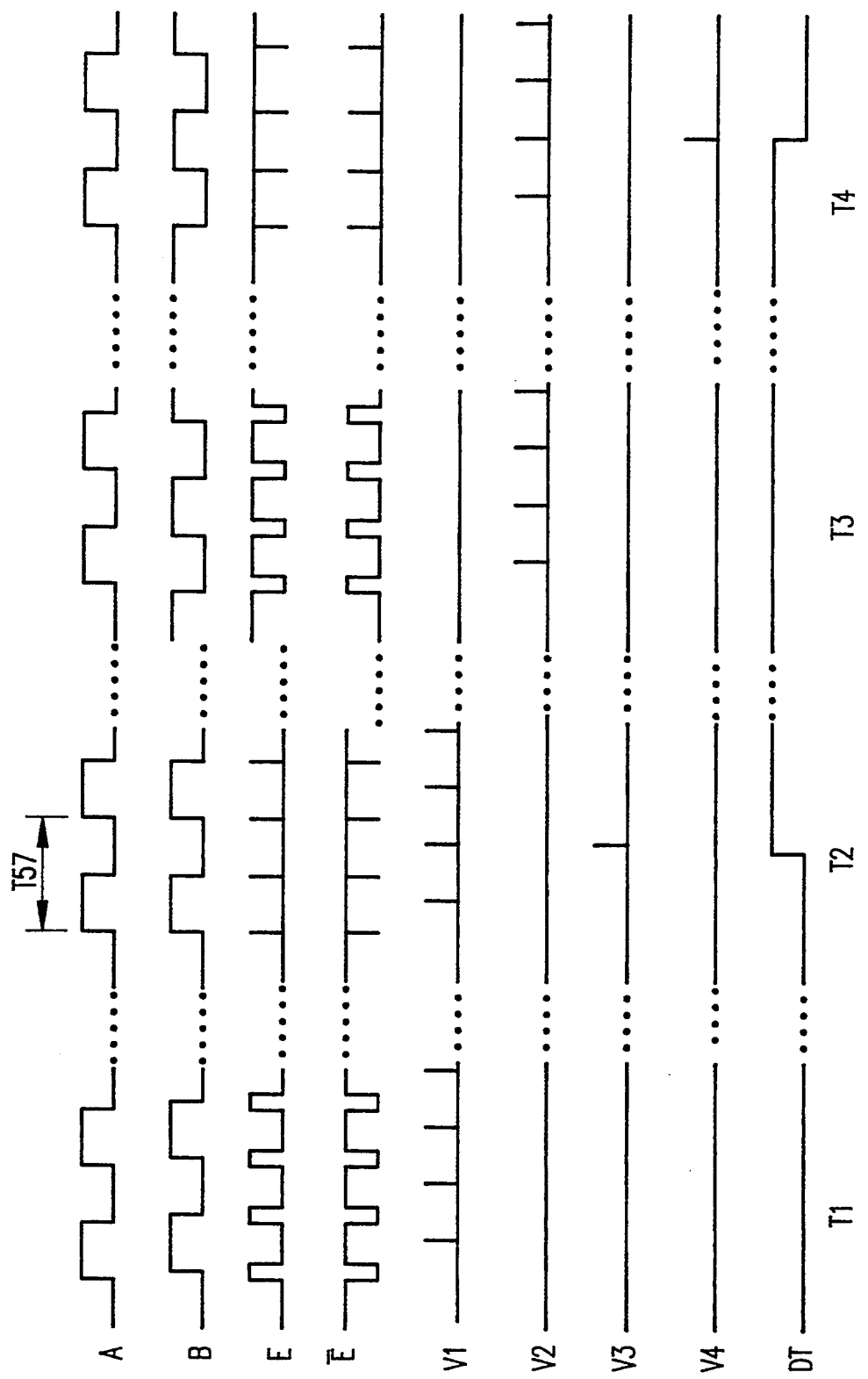
FIG. 12 shows time diagrams of signals in the circuit arrangement according to FIG. 11

The function of the circuit arrangement according to FIG. 11 is now explained with reference to signals represented in FIG. 12. The signals being referenced in the same way as in FIG. 11, are illustrated in four different periods T1 to T4 characterized by dotted lines. The pulse widths of signal E and $\overline{E}$ depend from the phase difference of signals A and B. I.e. pulse width of signal E is smaller than that of signal $\overline{E}$, if phase difference is below 90°. This is the case during periods T1 and T2. During periods T3 and T4 phase difference, however, is greater so that pulse width or pulse duty ratio of signal E is greater than that of signal $\overline{E}$.

For smaller phase differences counter 245 arrives more often at reference value S1 during a period of signals A and B than counter 246. Consequently counter 252 is incremented so often, so that it arrives at reference value S2 during a half bit clock period of RDS-signal, whereas counter 253 remains reset. After that flip-flop 257 is set using signal V3. For large phase differences i.e. if no level change of RDS-signal occurs, pulse duty ratio of E relative to $\overline{E}$ has changed with respect to the above situation so that counter 246 arrives at reference value S1 more often than counter 245. Consequently counter 253 arrives at reference value S2 and counter 252 remains reset. Consequently flip-flop 257 is reset through comparator 255. After each switching flip-flop 257 one of counters 252, 253 each is released for counting, the other one blocked. Due to the alternate latching of counters error resistance of circuit is amended. The resulting data pulse signal DT is fed to flip-flop 225 (FIG. 8).

Reference values S1 and S2 are selected so that setting or resetting of flip-flop 257 is assured even with disturbed reception signal as long as the one or the other phase relation of RDS-signal prevails.

Figure 13:
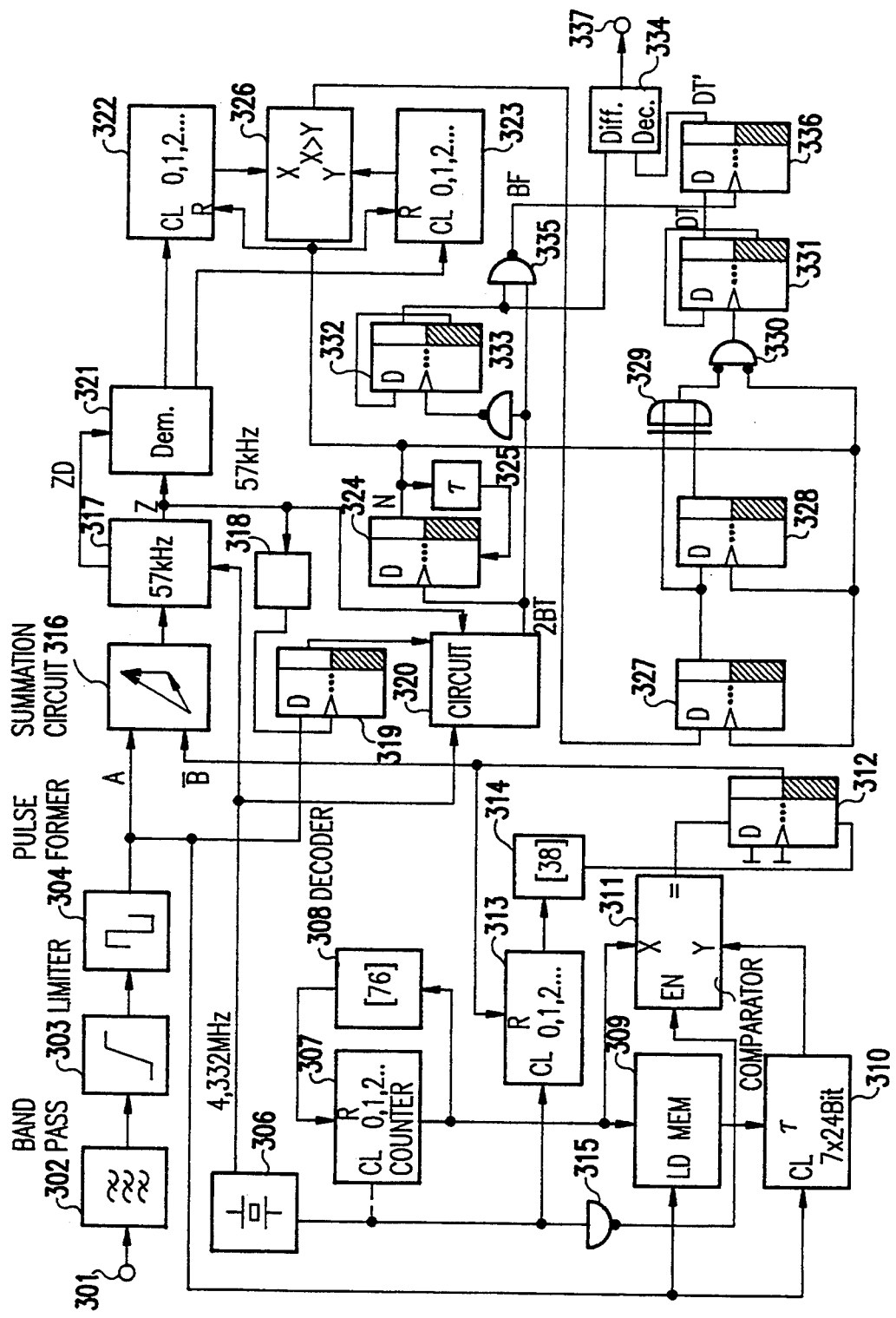
FIG. 13 is a block diagram of a demodulator according to a third embodiment of the invention

A third embodiment of demodulator is illustrated in FIG. 13 and is supplied with the received multiplex signal at 301. By means of bandpass 302 RDS-signal is derived from the multiplex signal; amplitude of RDS-signal is limited in a subsequent limiter 303. From the limited RDS-signal pulse former 304 forms a square wave signal having a pulse duty ratio of 50% and comprising phase modulation of RDS-signal; said signal is called signal A.

For producing an 57-kHz-signal a quartz oscillator having a frequency of 4,332 MHz is used, which frequency is divided by 76 by means of a first counter 307 and a first decoder 308. As soon as first counter 307 receiving output signal of quartz oscillator 306 as clocked has counted to 76 this is detected by decoder 308 and counter is reset.

By means of circuits 309 to 315 signal A is delayed by a half period of RDS-bit-clock. Phase relation of signal A is exactly conserved also in the delayed signal. Delayed signal is called signal B. At each positive edge of signal A counter state of counter 307 comprising 7 bits is transferred to memory 309. Thereby the phase difference between the 57-KHz-clock-signal produced by means of counter 307 and decoder 308 and signal A is fixed for the respective edge of signal A. Said phase difference is delayed for a half bit clock period by means of delay circuit 310 being preferably implemented by seven shift registers having each a length of 24 bits.

Counter states being loaded to memory 309 are shifted to the output of shift registers by means of edges of signal A. Output signals of shift registers comprising seven bits are compared with counter state of counter 307 by means of comparator 311. The output signal of comparator is released if counter 307 is not incremented; for this purpose the 4,332 MHz clock signal is supplied to an enable input EN of comparator through an inverter 315. If the output signal of delay circuit 310 equals the counter state, a flip-flop 312 is set and counter 313 released thereby starting a pulse of signal B. If counter 313 arrives counter state [38] a decoder 314 resets flip-flop 312 thereby terminating the corresponding "1" level of signal B and resetting counter 313.

Signal $\overline{B}$ is taken from the inverting output of flip-flop 312 and fed together with signal A to circuit 316 for a vectorial summation. By means of said vectorial summation of signals A and $\overline{B}$ signal components are formed in radio data system with traffic broadcast signals which differ in phase by 180° if seen in half bit clock periods. For a radio data system without traffic broadcast signal signal components deviate correspondingly and positive and negative direction from the 57-KHz-frequency.

From signal $A+\overline{B}$, being referenced as Z, the 57-kHz subcarrier is recovered at 317 by using the 4,332 MHz clock signal and is rotated by 90° with respect to the RDS-signal component for RDS-reception with traffic broadcast signals. By means of the 57-kHz carrier being phase corrected at 318 and signal A a demodulated signal may be obtained by means of flip-flop 319 from which a doubled bit clock frequency is derived in circuit 320 by using the 4,332 MHz clock signal. Phase correction of the 57-Khz carrier at 318 is necessary due to an operation time of the vectorial summation.

For RDS-demodulation a signal ZD being derived from signal Z is evaluated the signal components of which having small amplitudes are ignored; for radio data system with traffic broadcast signal the signal components can be discriminated optimally. Signal ZD and derivation of 57-kHz carrier will be explained later with reference to FIGS. 17 and 18. Signal ZD and 57-kHz carrier are fed to a frequency/phase modulator 321 providing two output signals clocking counter 322, 323 each.

From a signal 2 BT having a double bit clock frequency spike pulses N are derived by using a flip-flop 324 and a delay circuit 325; spike pulses N serve for resetting counters 322, 323. At each pulse N the comparison result of counter states obtained by comparator 326 is transferred to a further flip-flop 327. Thereby the previous obtained result is transferred to a subsequent flip-flop 328. If the contents of flip-flops 327 and 328 are equal and pulse N has become "0" content of flip-flop 331 is changed. For this purpose outputs of flip-flops 327, 328 are connected with inverting inputs of the clock input of flip-flop 331 through an exclusive OR-circuit 329 and a AND-circuit 330. Consequently the RDS-data-pulse-signal DT is available at the output of flip-flop 331.

By the negative edge of the doubled bit clock signal 2 BT a further flip-flop 332 is clocked; for this purpose output of circuit 320 is connected to clock input of flip-flop 332 through an inverter 333. Flip-flop 332 is connected as divider by two and supplies the bit clock BT for a RDS difference decoder 334 which is well-known and therefore not described here.

From clock signals 2 BT and BT a clock signal BF is formed using a NAND-circuit 335; said clock signal BF clocks flip-flop 336 transferring RDS-data clock signal from output of flip-flop 331 to RDS-difference decoder 334 at the output 337 of which demodulated RDS-signal can be obtained.

Figure 14:
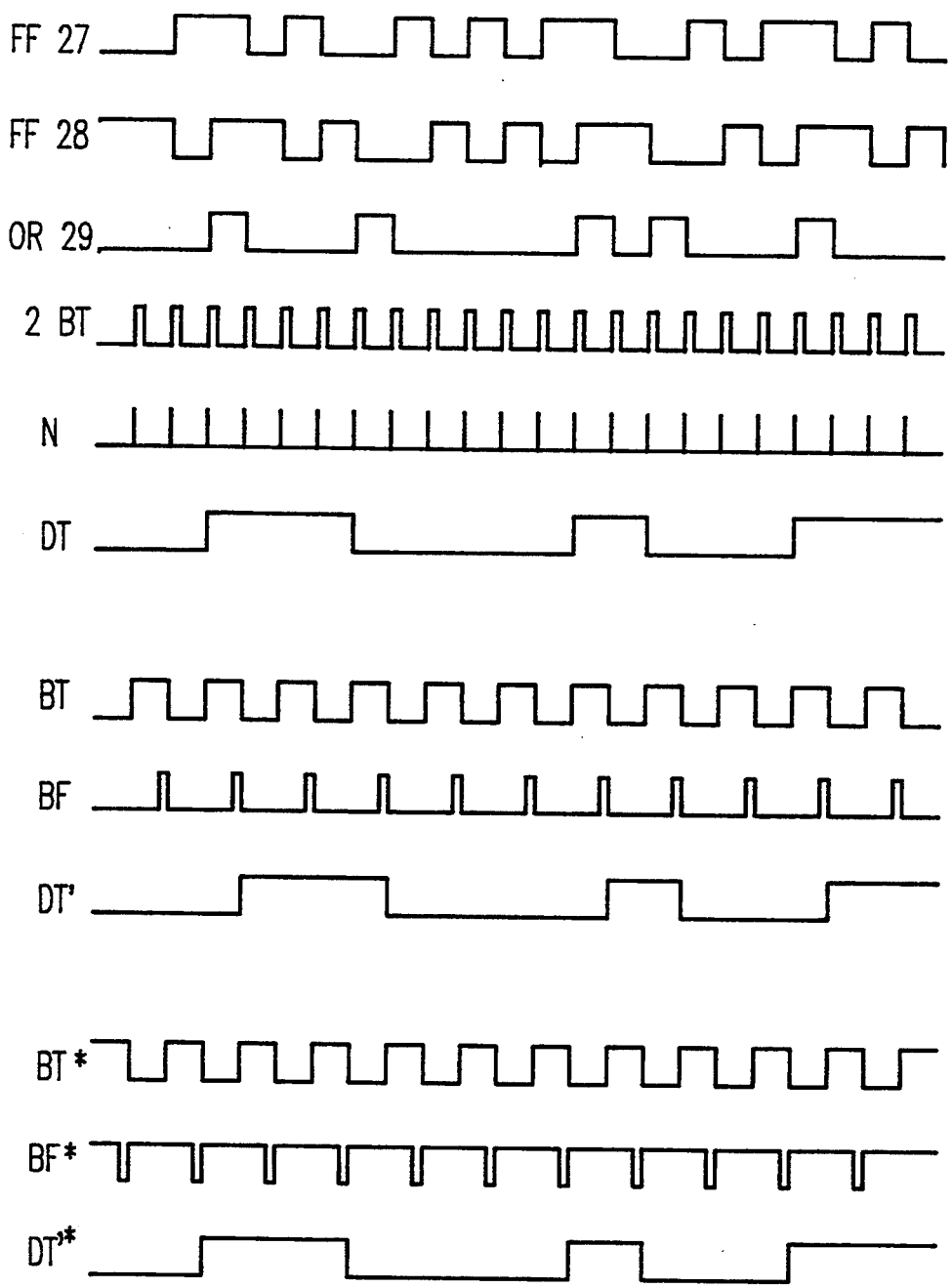
FIG. 14 shows time diagram of signals occurring in the demodulator according to FIG. 13

FIG. 14 shows time diagrams of various signals occuring in demodulator according to FIG. 13. The two lines being referenced by FF27 and FF28 represent output signals of flip-flops 327 and 328 being relatively shifted to each other for one period of clock 2BT. At the times of spike pulses N flip-flop 331 is triggered if output signals of flip-flops 327 and 328 have the same level. Thereby signal DT is produced.

Due to the frequency division by means of flip-flop 332 two different phase relations of signal BT may occur. Both possibilities are represented in FIG. 14 wherein those signals belonging to the second possibilities are remarked by *. The resulting phase shift of the RDS-signal does not result in disadvantages.

Figure 15:
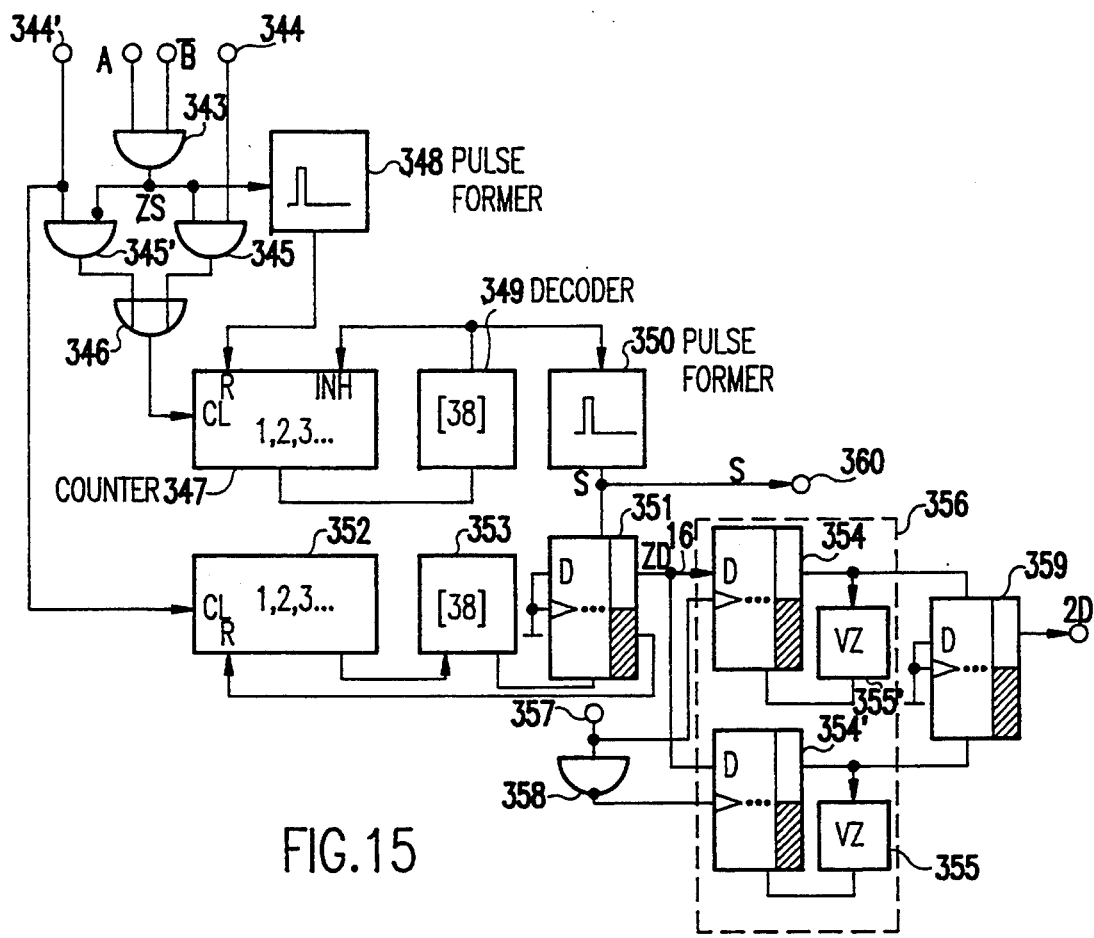
FIG. 15 shows a circuit for implementing a vector addition indicated in FIG. 13
Figure 16:
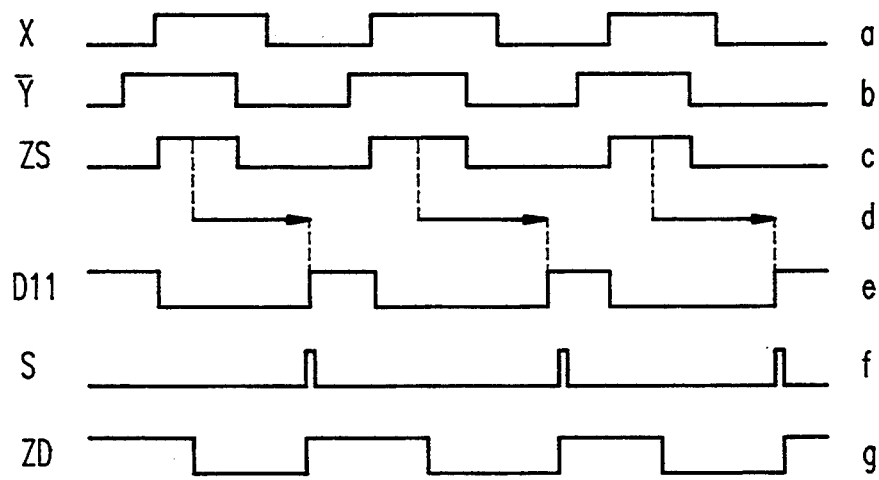
FIG. 16 shows time diagrams of signals occurring in the circuit arrangement according to FIG. 15

The vectorial summation 316 indicated in the block diagram of FIG. 13 is preferably performed by the digital circuit represented in FIG. 15. Signals occuring in this circuit are shown in FIG. 16. Via inputs, signals A and B (line a and b) are fed to AND-circuit 343 at the output of which signal ZS (line c) is present. As long as signal ZS=1 count pulses having a frequency of 2,166 MHz and being fed to input 344 arrive at clock input of counter 347 through AND-circuit 345 and OR-circuit 346. During the remaining time, in which ZS=0 is valid, counter 347 works with quartz clock signals having a frequency of 4,332 MHz and arriving at counter 347 through a further input 344', a further AND-circuit 345' and OR-circuit 346.

By means of pulse former 348 a spike pulse is derived from each positive edge of signal ZS, said spike pulse resetting counter 347. To the output of counter 347 a decoder 349 is connected blocking counter 347 at counter state [38]. Furthermore output signal of decoder 349 (line e) is fed to a further pulse former 350 supplying at each positive edge of the output signal of decoder 349 a short sync pulse S to an output 360 and to a set input of flip-flop 351 (line f). Since counter 347 is clocked during ZS=1 by half quartz clock frequency counter 347 seems to start counting of quartz clock pulses in the middle of the pulses of signal ZS. Said fictive count mode is represented in line d of FIG. 16 by arrows.

Quartz clock of 4,332 MHz frequency supplied at 344' furthermore arrives at clock input of further counter 352 the output of which is connected to the input of further decoder 353 comprising a selectable value of [38]. Output of decoder 353 is connected to reset input of flip-flop 351, the inverting output of which is connected to reset input of counter 352. At the non-inverting output of flip-flop 351 signal ZD is present which is represented in line g of FIG. 16.

As soon as flip-flop 351 is set by sync pulse S counter 352 can start counting and resets flip-flop 351 through decoder 353 after value [38]is reached. Signal ZD is phase-shifted by 90° relative to the vectorial summation signal.

Signal ZD is furthermore fed to data inputs of two flip-flops 354, 354'. Said flip-flops form together with delay circuits 355, 355' a frequency/phase demodulator 356. Through an input terminal a recovered 57-KHz subcarrier is fed which directly arrives at clock input of flip-flop 354 and after inversion at 358 at clock input of flip-flop 354'. Each setting of one of the flip-flops 354, 354' effects through delay circuits 355, 355' a subsequent resetting of flip-flops. By means of output pulses of flip-flop 354 a further flip-flop 359 is set. By output pulses of flip-flop 354' flip-flop 359 is reset. Flip-flop 359 supplies at its output the demodulated signal ZD.

Figure 17:
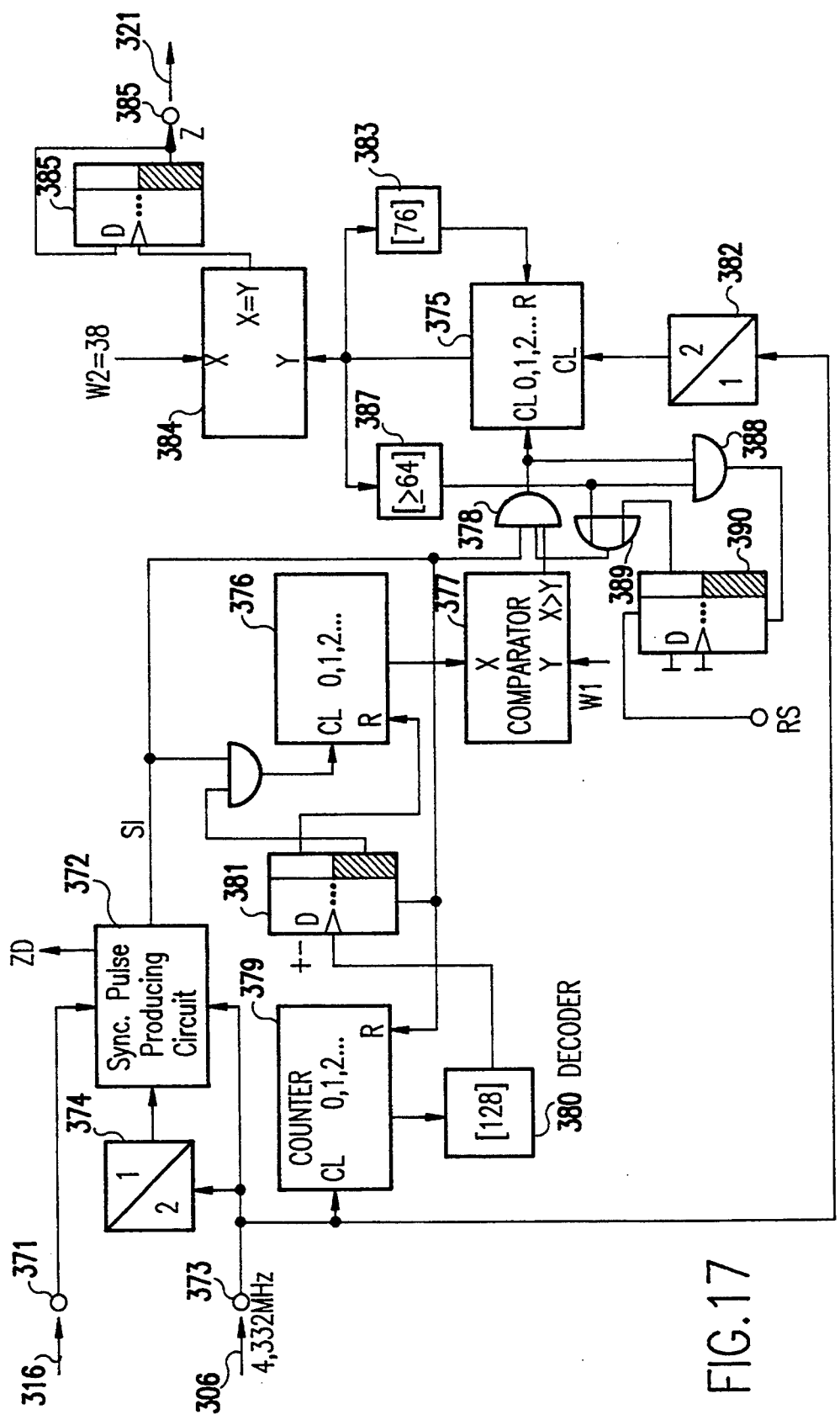
FIG. 17 is a block diagram of a carrier recovery circuit

FIG. 17 shows an embodiment of a carrier recovery circuit recovering a 57-kHz carrier from signal Z. For this purpose, the carrier recovery circuit receives signal Z to circuit 372 for generating sync pulses via input terminal 371, the 4,332 MHz clock signal through further input terminal 373 directly and a signal of half frequency through frequency divider 374. Details of circuit 372 will be described later in detail with reference to FIG. 18.

Sync pulses SI produced by circuit 372 occur if signal Z corresponds essentially exactly to a 57-kHz clock period and matches with the phase of a synchronizeable divider being part of circuit 372. By AND-circuit 378 sync pulses SI will only then be released for synchronization of counter 375 if a further counter 376 has exceeded a reference value W1 present at comparator 377. Furthermore it is checked by means of counter 379, decoder 380 and flip-flop 381 whether or not sync pulse sequence S1 incrementing counter 376 is continuous. During pulse gaps counter 379 arrives at a value of e.g. [128] predetermined by decoder 380. In this case flip-flop 381 is set and counter 376 reset. Counter 376 may be restarted by the next pulse of signal SI. Counter 375 is clocked with double frequency produced from the 4,332 MHz clock signal by means of a frequency doubler 382 and is reset by means of decoder 383 at counter state [76].

Furthermore counter 375 can only be synchronized if the counter state "≧64" has been arrived or flip-flop 390 is set. The corresponding operation is performed by OR-circuit 389. This measure serves for making ineffective sync pulses in counting range 0 to 63 of counter 375 since they are to be regarded as noise. However, for assuring a quick synchronisation of demodulator it is necessary to lift said condition as long as a sync pulses lies within count range "≧64". For this flip-flop 390 is set by an externally generated pulse "RS" at the beginning of transient time for synchronization.

Said four conditions for synchronizing counter 375 serve for avoiding jitter of 57-kHz carrier. Since counter 375 is clocked by double frequency of quartz clock signal and is reset at counter state [76] counting period corresponds to a frequency of 114 KHz. By means of comparator 384 to which a reference value W2=38 is fed, counter state [38] is selected. By the output pulse of comparator 384 a flip-flop 385 is triggered supplying the wanted 57-kHz carrier at its output which carrier is phase angle rotated by 90° with respect to signal ZD in an RDS-system with traffic broadcast signals.

Figure 18:
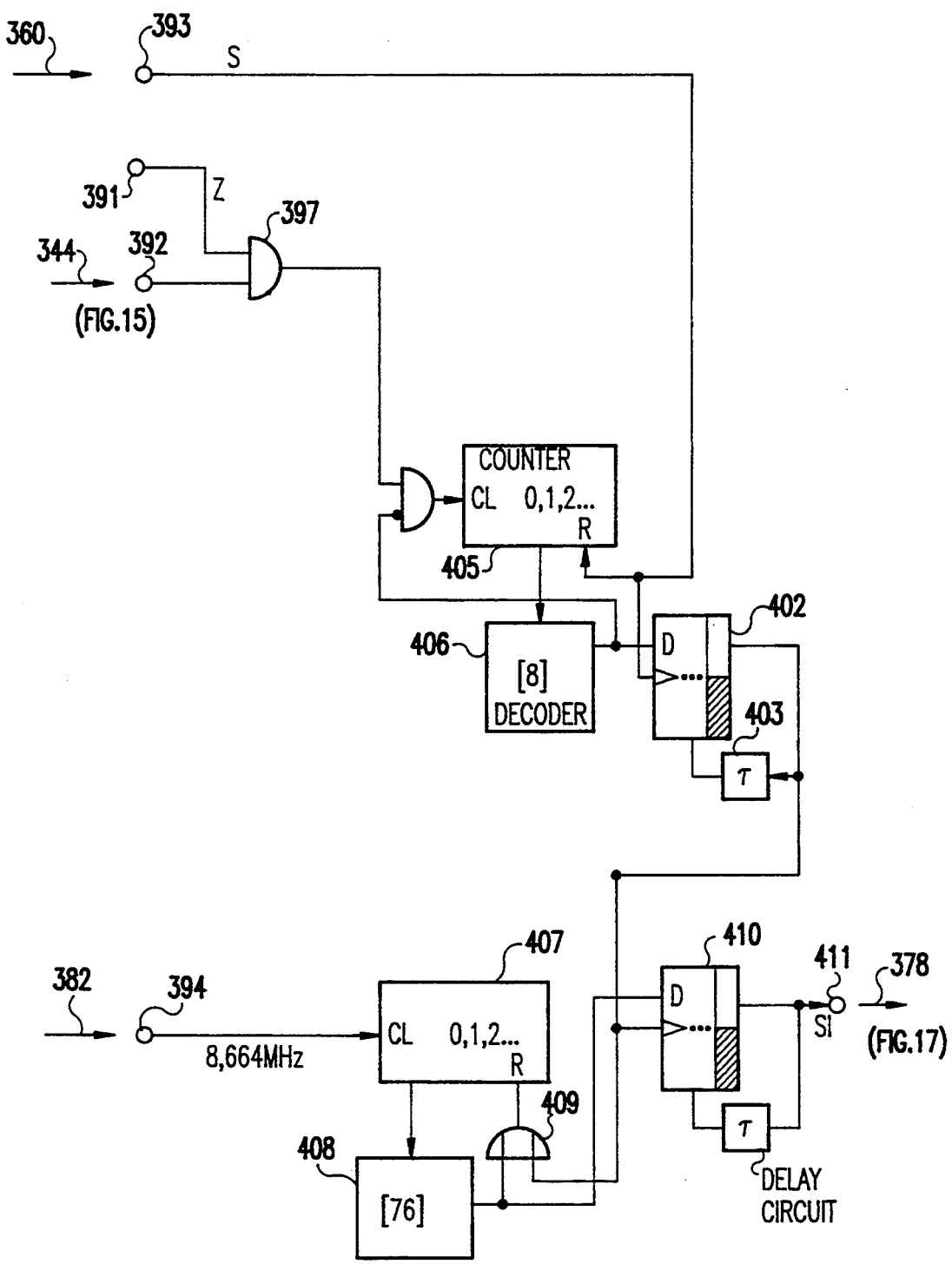
FIG. 18 is a block diagram of a circuit for producing synchronous pulses said circuit being part of the carrier recovery circuit according to FIG. 17

FIG. 18 shows a block diagram of circuit 372 (FIG. 17) for producing sync pulses SI. Said circuit receives through input terminals 391, 392, 393, 394 signal Z, the 2,166-MHz clock signal, sync pulse S and the clock with double frequency of 4,332-MHz clock signal.

The positive edge of sync pulse S clocks a flip-flop 402, which is reset after a short duration determined by a delay member 403. The spike pulse is however produced only if counter 405 has arrived at a value preselected in a decoder 406. Thereby only Z-pulses are evaluated which have a predetermined pulse width.

By output pulses of flip-flop 402 a synchronizable frequency divider is started consisting of counter 407, decoder 408, and OR-circuit 409. The period of the signal produced by counter 407 corresponds to a half clock period of 57-kHz.

The production of sync pulses SI is based on counter 407 working on double quartz clock frequency. If the positive edge of output pulses of flip-flop 402 occurs during the reset operation effected by decoder 408 a spike pulse is produced by flip-flop 410 and can be taken from output 411 as signal SI.

In this case it can be expected that during reception of RDS-signals with traffic broadcast signal the phase of signal Z can be evaluated for synchronization and that for RDS-signals the actual signal Z lies in the region of 57-kHz.

Sync pulses S occur regularly in time intervals of 57-kHz clock periods. The count period of counter 407 corresponds to 114-kHz whereby it does not matter whether the carrier is synchronized at its positive or negative clock pulse edge.

Circuit 320 (FIG. 13) for obtaining the doubled bit clock frequency will now be described with reference to FIG. 19. Counter 421 serves as a pre-divider and is clocked by means of 57-kHz carrier supplied at 422. By means of three decoders 423 to 425 pulses are derived at three adjacent counter states; one pulse each is selected by means of a switch of 426 for clocking a further counter 427 the output of which is connected to an eight fold decoder 428 at the outputs A to H of which one pulse each is present at one of eight adjacent counter states.

By means of counters 421 and 427 a clock with a doubled bit clock frequency is essentially derived. The described decoders as well as the now described circuits, however, serve for adjusting the phase of bit clock after a shortest possible time. For this purpose a signal is fed through input terminal 429 which is produced by demodulation of signal A by means of flip-flop 319 and 57-kHz carrier (FIG. 13). From clock edges of this signal spike pulses are derived in a pulse former 430 which spike pulses are fed to a pulse release circuit 431 which will be described later with reference to FIG. 21.

Output pulses I of pulse release circuit are fed to a phase selection circuit 432 which selects out of pulses present at outputs A to H that pulse having the correct phase relation and gates said pulse as signal 2BT having a doubled bit clock frequency to output 433. By means of a circuit 434 for a phase fine adjustment one of the output signals of decoders 423, 424, 425 as selected through switch 426.

The phase selection circuit 432 (FIG. 19) will now be described with reference to FIG. 20. Only two parts of the eight identical parts are illustrated. Pulses A to H of decoder 428 (FIG. 19) are fed to inputs 441 to 448. Through a further input 449 the phase selection circuit receives pulses I of release circuit 431 (FIG. 19). Said pulses I are combined with each of pulses A to H in AND circuits 451 to 458, the outputs of which are connected to clock inputs of counters 461 to 468. Connected to them are decoders 471 to 478, the outputs of which are connected to memory 479 and OR circuit 480. The output of OR circuit 480 is connected to reset inputs of counters 461 to 468 and with one input of AND circuit 461, the other input of which receives a release signal F being supplied by phase fine adjusting circuit 434 (FIG. 19).

Output terminals of memory 479 are connected to OR circuit 499 through an AND circuit 491 to 498 each; at the output 500 of OR circuit 499 clock signal 2BT can be obtained. The values of decoders 471 to 478 are identical. One of the counters arrives at first at the decoder value which leads to reset of all counters through OR circuit 480, and this process is repeated. At each reset of counters the decoded counter states are transferred into memory 479 wherein only that counter having arrived at first at decoder value has a "1" level at the output terminal of its related decoder. By means of AND circuits 491 to 498 and the outputs of memory 479 that pulse A to H is selected showing the correct phase.

Figure 19:
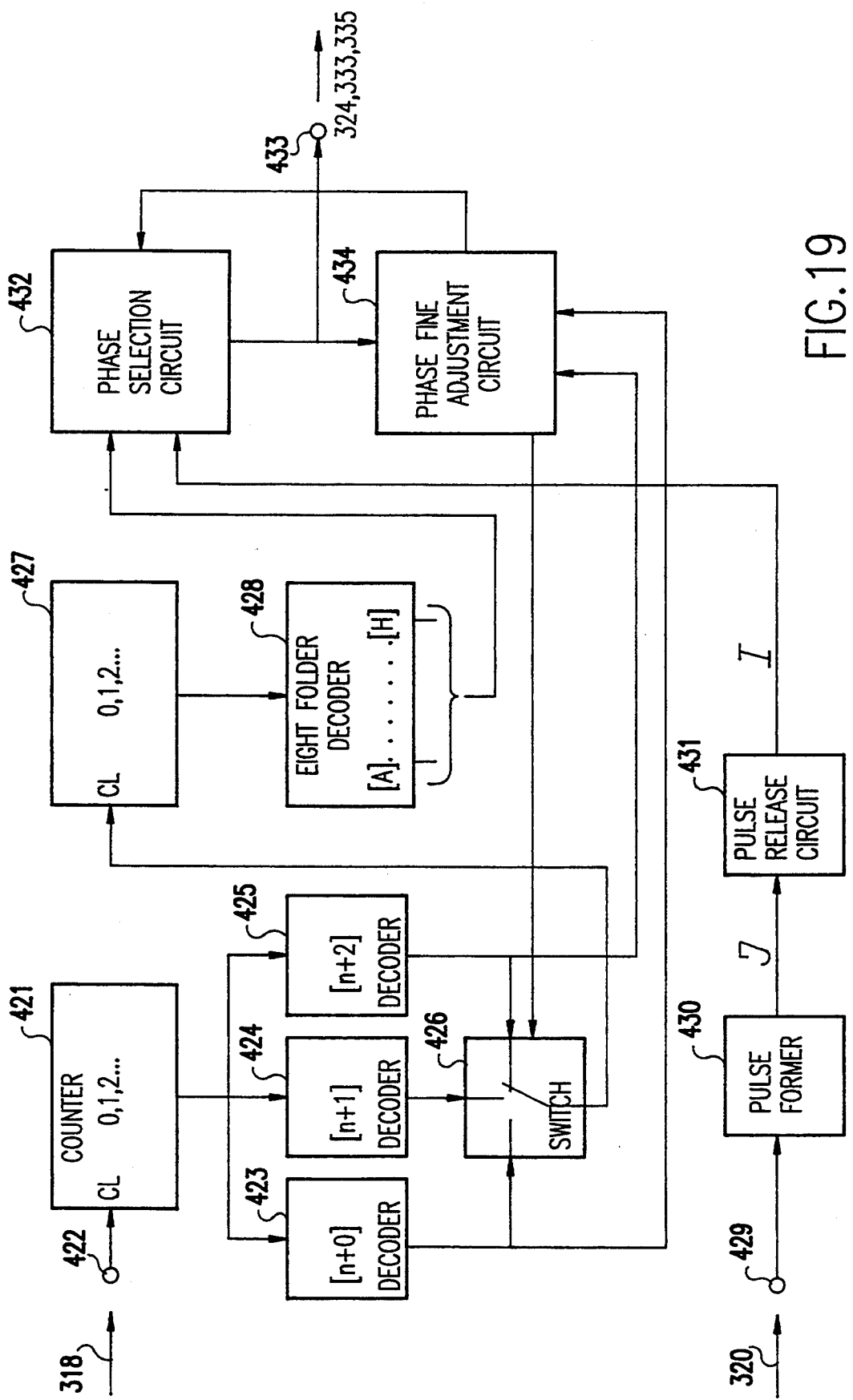
FIG. 19 is a block diagram of a circuit for producing a doubled bit clock frequency FIGS. 20 to 22 block diagrams of parts of the circuit according FIG. 19.
Figure 20:
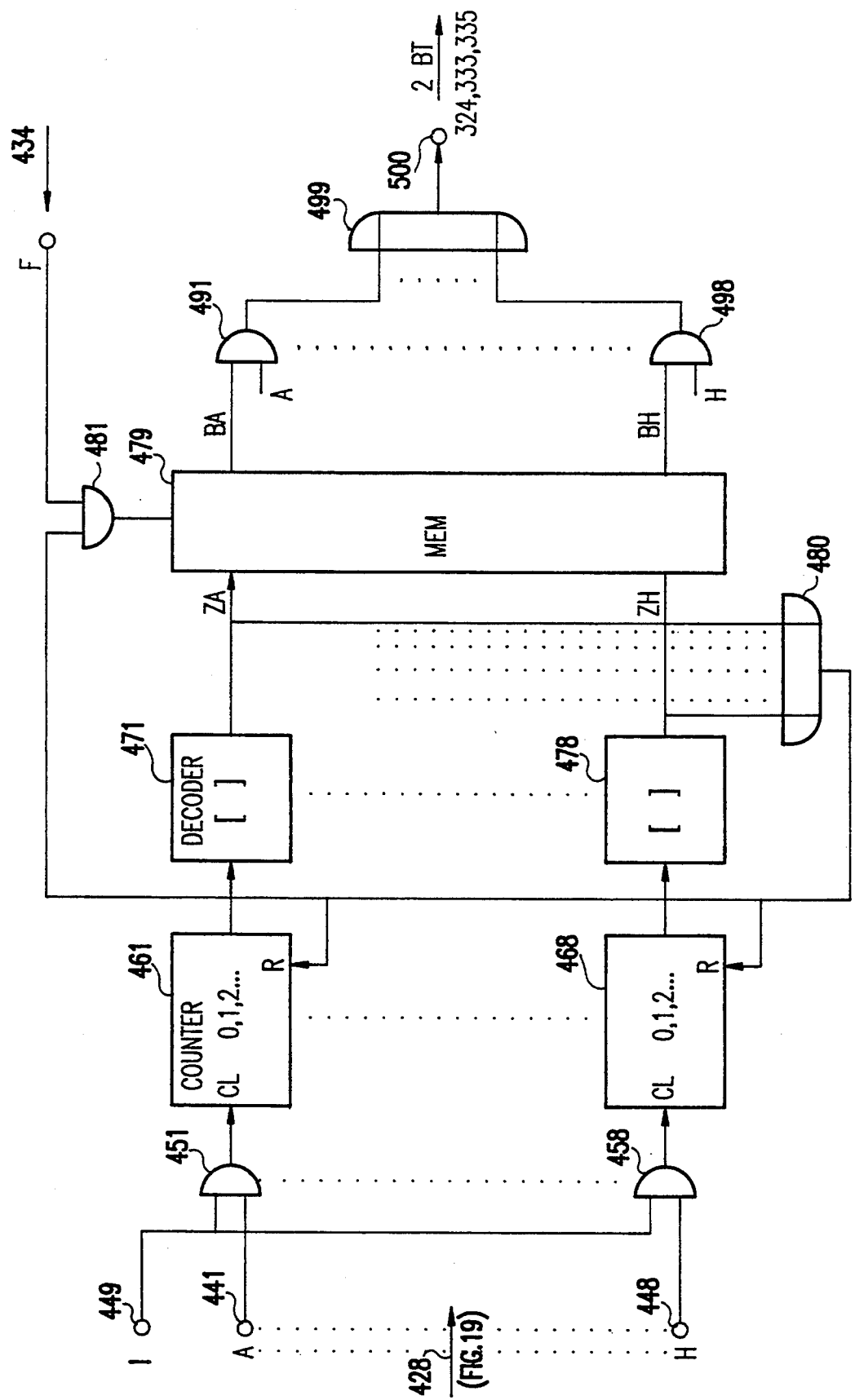
Figure 21:
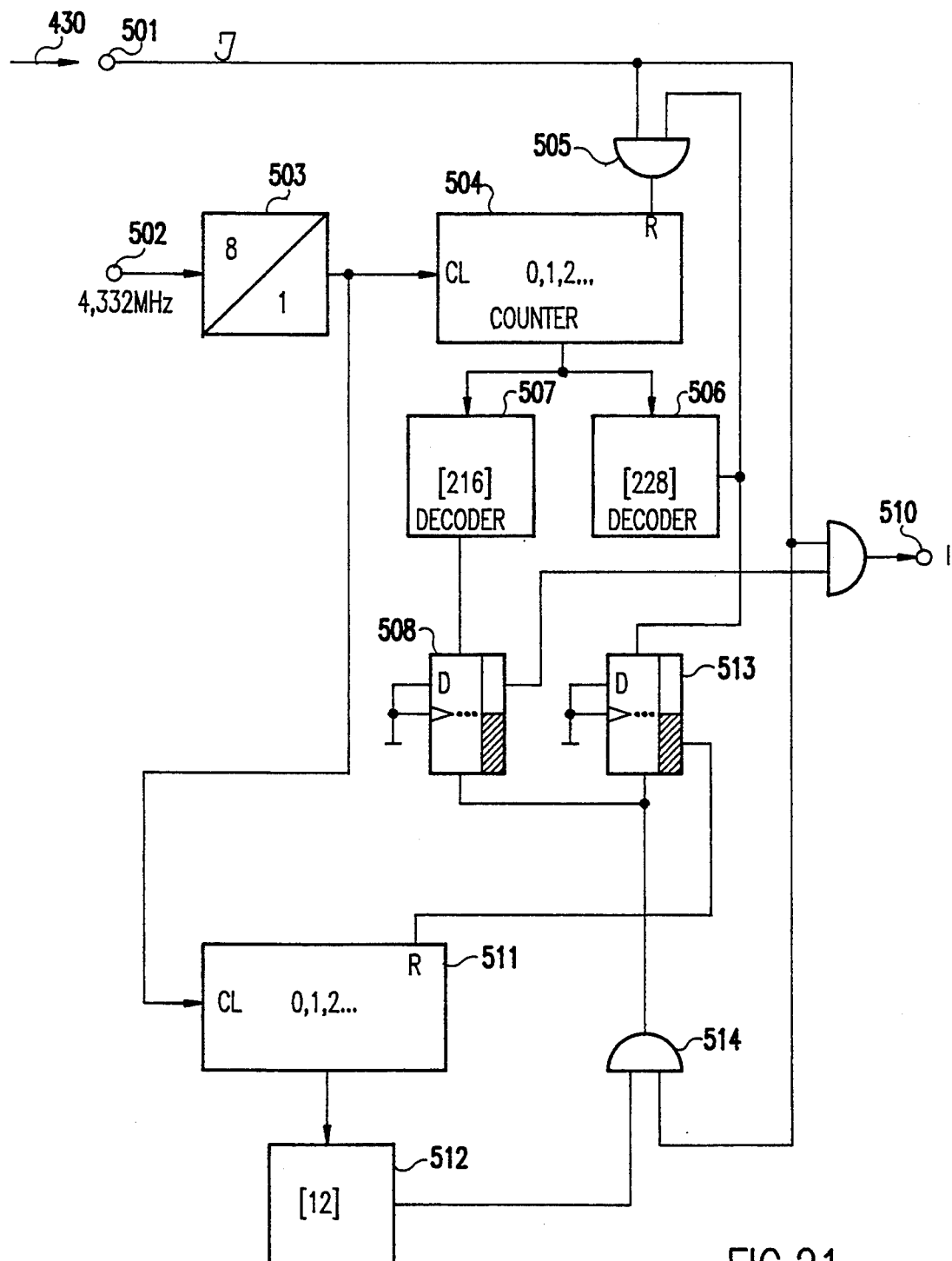

FIG. 21 shows a block diagram of pulse release circuit 431 (FIG. 19). Output signal of pulse former 430 (FIG. 19) is fed to a first input 501 whereas the 4,332 MHz clock signal is fed to a second input 502 and subsequently divided by eight at 503. By this signal counter 504 is clocked which counter is reset through an OR circuit 505 by pulses J supplied at 501.

Counter is furthermore reset by means of decoder 506 connected to the output of counter 504, if the counter value [228] has been reached.

To the output of counter 504 furthermore a decoder 507 is connected releasing a pulse at counter state [216] which pulse setting a flip-flop 508.

The clock frequency for the counter is due to frequency division 541,5 kHz so that 228 periods of the half RDS bit clock period corresponds to 421,1 µs. In the range of 216 periods (decoder 507) to 240 periods spike pulses I are released for the phase selection circuit 432 (FIG. 19); for this purpose output of flip-flop 508 is connected to output 510 of pulse release circuit through AND circuit 509.

The trailing edges of pulses for 240 periods are determined by means of a further counter 511, further decoder 512, and a further flip-flop 513. As soon as counter 504 has arrived at value [228], flip-flop 513 is set and counter 511 started which counter counts to [12], after which decoder 512 resets both flip-flops through OR circuit 514. Both flip-flops are also reset if pulse J is present. Only those spike pulses supplied from pulse former 430 (FIG. 19) falling into a time slot produced by pulse release circuit are fed as pulses I to phase selection circuit 432 (FIG. 19) via output terminal 510, since they can be considered as correct and evaluable for recovering the RDS bit clock signal.

Figure 22:
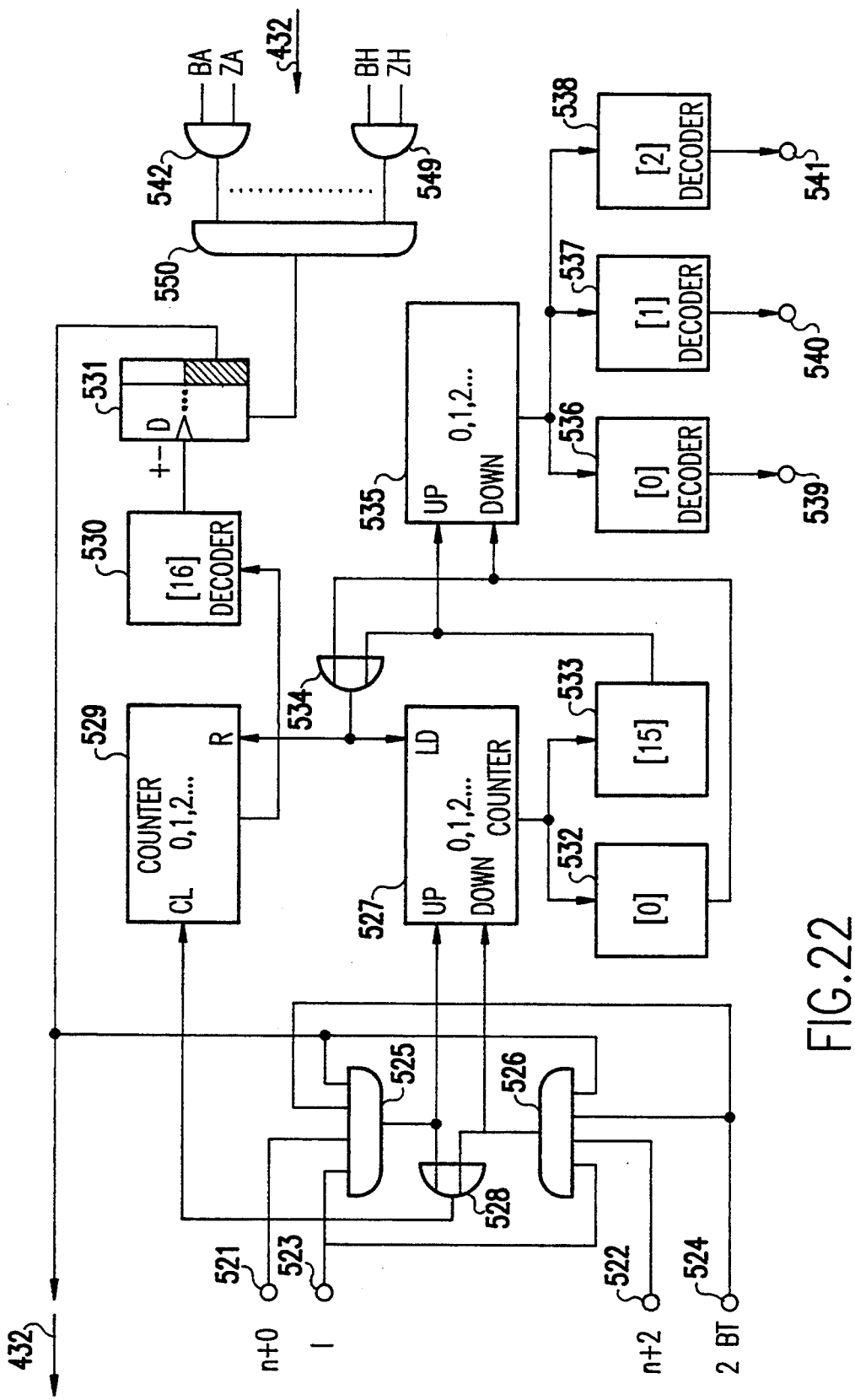

FIG. 22 shows a block diagram of phase fine adjusting circuit 434 (FIG. 19). Within the time slot released by decoder 423 to 425 of counter 421 (FIG. 19) a determined number of I-pulses are present. By means of the adjusting circuit that state of switch 426 has detected in which the same number of I-pulses are present in both external ranges which are characterized by n+0 and n+2. During said partial ranges "1" is present alternately at inputs 521, 522. Further inputs 523, 524 receive I-pulses and clock signal 2BT with doubled bit frequency. The input signals are combined by AND circuits 525, 526 so that I-pulses occurring during partial range n+0 increment in up/down counter 527 whereas I-pulses occurring during partial range n+2 decrement up/down counter 527. This only happens during pulses of signal 2BT.

Output terminals of AND-circuits 525 and 526 are connected to an input of OR circuit 528 each the output of which is connected to a clock input of counter 529. Decoder 530 produces a signal if counter state of counter 529 has arrived at [16] and sets a flip-flop 531. Two decoders 532, 533 having the values [0] and [15] are related to up/down counter 527. As soon as one of said counter states has arrived, counter 529 is reset through OR circuit 534 and a predetermined value is loaded into up/down counter 527. Furthermore the output pulses of decoders 532, 533 serve for incrementing or decrementing a further up/down counter 535. To the output of said further up/down counter 535 three decoders 536, 537, 538 are connected which deliver a signal each at their outputs 539, 540, 541 effecting a corresponding state of swich 426 (FIG. 19).

If essentially the same number of I-pulses occur in the partial ranges n+0 and n+2 counter 529 can count up to value [16] where upon decoder 530 sets flip-flop 531. If, however, up/down counter-527 arrives within a shorter period at value [0] or [15] it will be reloaded to the medium value [8] and counter 529 is restarted before it has arrived at value [16]. Furthermore the value of up/down counter 535 is changed by [1] in that direction which is suited for achieving the wanted distribution of I-pulses by means of a new state of switch 426 (FIG. 19).

After flip-flop 531 has been set the phase fine adjusting has been interupted. It may be reactivated if another one of counters 461 to 468 (FIG. 20) than that one the value of which has been transferred to memory 479 arrives at the corresponding decoder value. In this case "1" is present at one of outputs of gates 542 to 549 thereby resetting flip-flop 531 through OR circuit 550.

By means of the described circuit it is achieved that after a short time phase fine adjusting is automatically interupted so that RDS bit clock is practically free from jitters. Only for greater phase errors the adjustment is restarted so that a great error resistance of RDS bit clock generation is achieved.

I claim:

1. Demodulator for radio data signals, the transmission of which is performed by phase-keying of a suppressed subcarrier, comprising:

means for transforming a received signal of a subcarrier frequency into a first square wave signal;

means for forming a second square wave signal of subcarrier frequency;

means for comparing phase information of the first and second square wave signals at predetermined times;

means for evaluating a resulting phase difference between the first and second square wave signals; and means for producing a demodulated radio data signal from the phase difference between the first and second square wave signals.

2. Demodulator according to claim 1, characterized in that the received signal of subcarrier frequency is transformed into the first square wave signal having a constant pulse duty ratio.

3. Demodulator according to claim 1, wherein the resulting phase difference between the first and second square wave signals is evaluated with respect to the progression in time and the amplitude, and that at the occurrence of a phase difference within a predetermined time interval a load pulse is derived which matches the phase relation of said second square wave signal with the phase relation of the first square wave signal and forms a first edge of the demodulated radio data signal.

4. Demodulator according to claim 3, characterized in that the means for evaluating the phase difference between the first and second square wave signals includes a detecting means for detecting the pulse width of a third square wave signal which is derived from the first and the second square wave signals by means of a logic circuit.

5. The demodulator as recited in claim 4, wherein the logic circuit is an exclusive-OR circuit.

6. Demodulator according to claim 3, characterized in that the means for transforming includes a first counter started by the received signal of subcarrier frequency which is clocked by a frequency being a multiple of the subcarrier frequency and which is reset after arriving at a half multiple.

7. The demodulator as recited in claim 6, wherein the multiple is a value of 76.

8. Demodulator according to claim 6, wherein the means for forming a second square wave signal includes a second counter, which counter is clocked by a frequency being a multiple of the subcarrier frequency and which is reset after arriving at said multiple, that a counter state, occurring during a first edge of the first square wave signal within a duration predetermined by the load pulse, is loaded into a memory, that a first comparator compares the content of the memory with the counter state, and that, if both signals are identical, a first edge of the second square wave signal is produced, and half a period duration of the subcarrier later, a second edge of the second square wave signal is produced.

9. The demodulator as recited in claim 8, wherein the multiple is a value of 76.

10. Demodulator according to claim 8, characterized in that a third counter is provided for which is also clocked by the multiple of subcarrier frequency, that the output of the first comparator is connected to an input of a first flip-flop, a reset input of which is connected to an output of a first decoder which edits a signal if the third counter has arrived at a counter state corresponding to the half period duration, and that an output of the first flip-flop is connected to reset input of the third counter.

11. Demodulator according to claim 10, characterized in that said load pulse is produced only if the phase difference between the first and second square wave signals depending on a first threshold value has continuously been reduced within a period starting from the last load pulse.

12. Demodulator according to claim 11, characterized in that the load pulse is produced only if the sum of all phase differences between the first and the second square wave signals since the last preceding load pulse exceeds a predetermined second threshold value.

13. Demodulator according to claim 12, wherein the means for producing a demodulated signal includes a clock signal having the frequency of the subcarrier that is derived from a quartz clock signal of a higher frequency by means of a first frequency division and that by means of a second frequency division a bit clock signal for the demodulated radio data signal is produced.

14. Demodulator according to claim 13, characterized in that at least one shift register is provided for the second frequency division, said at least one shift register is set to a predetermined value at the time a data pulse signal being derived from the load pulse occurs.

15. Demodulator according to claim 14, characterized in that the output of said at least one shift register is connected to an input of another shift register at an output of which the bit clock signal is present, that the data pulse signal being derived from the load pulse triggers a second flip-flop, and that an output signal of the second flip-flop and said bit clock signal are fed to a difference decoder.

16. Demodulator for radio data signals, the transmission of which is performed by phase-keying of a suppressed subcarrier, comprising:
means for transforming a received signal of a subcarrier frequency into a first square wave signal;
means for delaying said first square wave signal for a half period of a bit clock of the radio data signal to form a delayed square wave signal of subcarrier frequency;
means for measuring a resulting phase difference between the first and delayed square wave signals;
means for deriving a data pulse signal, said signal being one of a first level and a second level depending on the polarity of the phase difference; and
means for producing a demodulated radio data signal from the phase difference between the first and delayed square wave signals.

17. Demodulator according to claim 16, wherein the means for delaying includes an oscillator for producing a frequency on a multiple of the frequency of subcarrier, and further comprising a fourth counter, which is reset at a counter state corresponding to said multiple, that the counter state at which a first edge of the first square wave signal is present is delayed for a half bit clock period, and that a first edge of the delayed square wave signal on subcarrier frequency is derived if the counter state corresponds to the delayed counter state.

18. Demodulator according to claim 17, characterized in that the delay is performed by means of shift registers.

19. Demodulator according to claim 18, characterized in that the means for delaying further comprises a fifth counter which is clocked by a multiple of the frequency of subcarrier and which is started by the first edge of the delayed square wave signal on subcarrier frequency and is terminated after said fifth counter has reached half of said multiple whereby a second edge of the delayed square wave signal on subcarrier frequency is derived.

20. Demodulator according to claim 19, characterized in that one of said first and second levels of said data pulse signal changes only if the phase of the first square wave signal on subcarrier frequency has been changed relatively to the phase of the delayed square wave signal on subcarrier frequency for a certain predetermined amount.

21. Demodulator according to claim 20, wherein the means for deriving a data pulse signal further comprises sixth, seventh, eighth, and ninth counters for counting first and second pulses using clock pulses of an oscillator and that the data pulse signal is set on the corresponding one of said first and second levels if a predetermined counter state has been arrived by the respective counter.

22. Demodulator according to claim 21, characterized in that clock signals counted during the existence of phase differences between the first square wave signal of subcarrier frequency and the delayed square wave signal of subcarrier frequency are separately compared for both polarities of the phase differences with a third threshold value, that said eighth and ninth counters for each polarity of phase difference is clocked if the third threshold value has been reached, and that counter states of said eighth and ninth counters are compared with a fourth threshold value and that one of said first and second levels of the data pulse signal is set if one of the eighth and ninth counters has arrived at the fourth threshold value.

23. Demodulator according to claim 22, characterized in that the eighth and ninth counters are alternately released and reset through a third flip-flop.

24. Demodulator for radio data signals, the transmission of which is performed by phase-keying of a suppressed subcarrier, comprising:
means for transforming a received signal of a subcarrier frequency into a first square wave signal;
means for delaying said first square wave signal for a half period of a bit clock of the radio data signal to form a delayed square wave signal of subcarrier frequency;
means for summing vectorially the first and delayed square wave signals to produce a fourth square wave signal of a certain phase derived from phases of the first and delayed square wave signals;
means for recovering the subcarrier frequency from the fourth square wave signal;
means for deriving a data pulse signal from the third square wave signal, said data pulse signal being one of a first level and a second level independent from the polarity of the measured phase difference between the square wave signal and the recovered subcarrier; and
means for producing a demodulated radio data signal from the phase difference between the first and delayed square wave signals.

25. Demodulator according to claim 24, characterized in that the fourth square wave signal is only evaluated for demodulation if the amplitude of the signal is sufficiently large.

26. Demodulator according to claim 24, characterized in that a signal having a doubled bit clock frequency is derived from the recovered subcarrier and the first square wave signal or the delayed square wave signal and is used for demodulation.

27. Demodulator according to claim 24, wherein the means for delaying includes an oscillator for producing a multiple of the frequency of the subcarrier and a tenth counter being reset at a counter state corresponding to said multiple, and that the counter state being present at first and second edges of the first square wave signal is delayed for half a bit clock period, and that a first edge of the delayed square wave signal of subcarrier frequency is derived if the counter states of said first square wave signal equal the delayed counter state.

28. Demodulator according to claim 27 characterized in that the delay is performed by means of shift registers.

29. Demodulator according to claim 27 wherein the means for delaying further comprises an eleventh counter which is clocked by a multiple of the frequency of subcarrier and is started by means of the first edge of the delayed square wave signal of subcarrier frequency, and stopped if the half multiple has been reached, whereby a second edge of the delayed square wave signal of subcarrier frequency is derived.

30. Demodulator according to claim 29, characterized in that count pulses are derived from the fourth square wave signal by means of a frequency/phase demodulator in dependence from the polarity from the phase difference, which count pulses being fed to a twelfth counter and a thirteenth counter, that said twelfth and thirteenth counters are reset by a frequency corresponding to the doubled bit clock frequency and that the counter states existing immediately before said reset are compared by a second comparator, the result of said comparison leading to a data pulse signal.

31. Demodulator according to claim 30, characterized in that a level change in data pulse signal is produced only if the output signal of the second comparator shows the same value within two periods of a clock signal having the doubled bit clock frequency.

32. Demodulator according to claim 30, characterized in that a carrier frequency for the frequency/phase demodulator is derived using a sync signal, edges of which starting essentially in the middle of the pulses of the first and delayed square wave signals, the count pulses being counted up to a predetermined count state and having a frequency during the pulses of the first and delayed square wave signals which is half the frequency within pulse gaps of the first and delayed square wave signals.

33. Demodulator according to claim 32, characterized in that a recovered 57-khz subcarrier of square waves is used for producing a clock signal having a doubled bit clock frequency, for demodulation of the first and delayed square wave signals having subcarrier frequency wherein pulse edges of the demodulated signals are used for determining the phase of said clock signal.

34. Demodulator according to claim 33, characterized in that phase determining pulses are effective only in a predetermined time interval.

35. Demodulator according to claim 34, characterized in that adjacent pulses are derived from the recovered carrier by means of a fourteenth counter and a plurality of decoders and that a pulse is selected for producing the doubled bit clock which coincides with the phase determining pulses.

36. Demodulator according to claim 35, characterized in that an averaging of phase determining pulses is performed during the pulses derived by means of said decoders for a fine phase determination of the clock signal by means of a phase fine adjusting circuit.

* * * * *